(12) United States Patent
Shaver, II et al.

(10) Patent No.: US 11,557,683 B2
(45) Date of Patent: Jan. 17, 2023

(54) DISTRIBUTED MAXIMUM POWER POINT TRACKING SYSTEM, STRUCTURE AND PROCESS

(71) Applicant: Solaredge Technologies Ltd., Herzeliya (IL)

(72) Inventors: Argil E. Shaver, II, Menlo Park, CA (US); Ronald M. Newdoll, Woodside, CA (US)

(73) Assignee: Solaredge Technologies Ltd., Herzeliya (IL)

( * ) Notice: Subject to any disclaimer, the term of this patent is extended or adjusted under 35 U.S.C. 154(b) by 71 days.

(21) Appl. No.: 16/840,956

(22) Filed: Apr. 6, 2020

(65) Prior Publication Data

US 2020/0321775 A1 Oct. 8, 2020

Related U.S. Application Data

(60) Continuation of application No. 15/722,310, filed on Oct. 2, 2017, now Pat. No. 10,615,594, which is a
(Continued)

(51) Int. Cl.
*H02H 9/04* (2006.01)
*H01L 31/02* (2006.01)
*H02J 3/38* (2006.01)

(52) U.S. Cl.
CPC ....... *H01L 31/02021* (2013.01); *H02H 9/041* (2013.01); *H02J 3/38* (2013.01);
(Continued)

(58) Field of Classification Search
None
See application file for complete search history.

(56) References Cited

U.S. PATENT DOCUMENTS 3,958,171 A 5/1976 Sekino
4,488,791 A 12/1984 Hinchliffe
(Continued)

FOREIGN PATENT DOCUMENTS

AU 2010101396 A4 2/2011
CN 201141544 Y 10/2008
(Continued)

OTHER PUBLICATIONS

Clark, et al.; "Plug-n-Play, Reliable Power Systems for Nanosatellites"; Aug. 14-17, 2006; 20.sup.th Annual AIAA/USU Conference on Small Satellites;retrieved on May 21, 2008 from website http://ssdl.stanford.edu/ssdl/images/stories/AA236/A06Fall/ARFC/ssc06-vi— 2.pdf.
(Continued)

*Primary Examiner* — Jared Fureman
*Assistant Examiner* — Aqeel H Bukhari
(74) *Attorney, Agent, or Firm* — Banner & Witcoff, Ltd.

(57) ABSTRACT

Distributed maximum power point tracking systems, structures, and processes are provided for power generation structures, such as for but not limited to a solar panel arrays. In an exemplary solar panel string structure, distributed maximum power point tracking (DMPPT) modules are provided, such as integrated into or retrofitted for each solar panel. The DMPPT modules provide panel level control for startup, operation, monitoring, and shutdown, and further provide flexible design and operation for strings of multiple panels. The strings are typically linked in parallel to a combiner box, and then toward and enhanced inverter module, which is typically connected to a power grid. Enhanced inverters are controllable either locally or remotely, wherein system status is readily determined, and operation of one or more sections of the system are readily controlled. The system provides increased operation time, and increased
(Continued)

power production and efficiency, over a wide range of operating conditions.

20 Claims, 24 Drawing Sheets

Related U.S. Application Data division of application No. 13/866,962, filed on Apr. 19, 2013, now Pat. No. 9,812,859, which is a continuation of application No. 13/250,887, filed on Sep. 30, 2011, now Pat. No. 8,427,009, which is a continuation of application No. 12/842,864, filed on Jul. 23, 2010, now Pat. No. 8,035,249, which is a continuation of application No. 12/056,235, filed on Mar. 26, 2008, now Pat. No. 7,772,716.

(60) Provisional application No. 60/908,361, filed on Mar. 27, 2007.

(52) U.S. Cl.
CPC ........... *H02J 3/381* (2013.01); *H02J 2300/26* (2020.01); *Y02A 30/60* (2018.01); *Y02E 10/56* (2013.01)

(56) References Cited

U.S. PATENT DOCUMENTS

| | | | |
|---|---|---|---|
| 4,599,685 A | 7/1986 | Hombu et al. | |
| 5,706,798 A | 1/1998 | Steinorth | |
| 5,742,495 A | 4/1998 | Barone | |
| 5,982,253 A | 11/1999 | Perrin et al. | |
| 6,153,823 A | 11/2000 | Shiozaki et al. | |
| 6,201,180 B1 | 3/2001 | Meyer et al. | |
| 6,285,572 B1 | 9/2001 | Onizuka et al. | |
| 6,291,762 B1 | 9/2001 | Jan et al. | |
| 6,750,391 B2 | 6/2004 | Bower et al. | |
| 6,810,339 B2 | 10/2004 | Wills | |
| 7,104,064 B2 | 9/2006 | Hon | |
| 7,443,052 B2 | 10/2008 | Wendt et al. | |
| 7,444,816 B2 | 11/2008 | Hon | |
| 7,731,383 B2 | 6/2010 | Myer | |
| 7,772,716 B2 | 8/2010 | Shaver, II et al. | |
| 7,866,927 B1 | 1/2011 | Wong | |
| 7,994,657 B2 | 8/2011 | Kimball et al. | |
| 8,035,249 B2 | 10/2011 | Shaver, II et al. | |
| 8,427,009 B2 | 4/2013 | Shaver, II et al. | |
| 2002/0066473 A1 | 6/2002 | Levy et al. | |
| 2002/0074034 A1 | 6/2002 | Fujisaki et al. | |
| 2003/0111103 A1 | 6/2003 | Bower et al. | |
| 2003/0177706 A1 | 9/2003 | Ullman | |
| 2004/0145188 A1 | 7/2004 | Janssen et al. | |
| 2004/0207366 A1* | 10/2004 | Sung ................ H02J 7/35 320/140 | |
| 2004/0261334 A1 | 12/2004 | Liebendorfer et al. | |
| 2005/0076563 A1 | 4/2005 | Faris | |
| 2006/0122738 A1 | 6/2006 | Yamada et al. | |
| 2006/0132102 A1 | 6/2006 | Harvey | |
| 2006/0171182 A1 | 8/2006 | Siri et al. | |
| 2006/0185727 A1 | 8/2006 | Matan | |
| 2006/0266408 A1 | 11/2006 | Horne et al. | |
| 2007/0089778 A1 | 4/2007 | Horne et al. | |
| 2007/0090653 A1 | 4/2007 | Martelon | |
| 2007/0113881 A1 | 5/2007 | Mellott et al. | |
| 2007/0210650 A1 | 9/2007 | Togashi | |
| 2007/0221267 A1 | 9/2007 | Fornage | |
| 2007/0271006 A1 | 11/2007 | Golden et al. | |
| 2008/0097655 A1* | 4/2008 | Hadar ............... H02J 13/00028 700/286 | |
| 2008/0149786 A1 | 6/2008 | Bradley | |
| 2008/0149791 A1 | 6/2008 | Bradley | |
| 2008/0150484 A1* | 6/2008 | Kimball ................ H02J 7/345 320/125 | |
| 2008/0169652 A1 | 7/2008 | Green | |
| 2008/0238195 A1 | 10/2008 | Shaver et al. | |
| 2009/0030605 A1 | 1/2009 | Breed | |
| 2009/0040750 A1 | 2/2009 | Myer | |
| 2009/0078299 A1 | 3/2009 | Cinnamon et al. | |
| 2009/0090895 A1 | 4/2009 | Hogan, Jr. | |
| 2009/0146501 A1 | 6/2009 | Cyrus | |
| 2009/0150005 A1 | 6/2009 | Hadar et al. | |
| 2009/0194669 A1 | 8/2009 | Noble et al. | |
| 2009/0199846 A1 | 8/2009 | Collins et al. | |
| 2009/0266353 A1 | 10/2009 | Lee | |
| 2009/0283129 A1 | 11/2009 | Foss | |
| 2010/0043851 A1 | 2/2010 | Levy et al. | |
| 2010/0205870 A1 | 8/2010 | Cobb | |
| 2010/0237305 A1 | 9/2010 | Miller | |
| 2010/0270808 A1 | 10/2010 | Bates et al. | |
| 2010/0284737 A1 | 11/2010 | McPheeters | |
| 2010/0296285 A1 | 11/2010 | Chemel et al. | |
| 2010/0328931 A1 | 12/2010 | Fogerlie | |
| 2010/0328932 A1 | 12/2010 | Fogerlie | |
| 2011/0005583 A1 | 1/2011 | Thomas | |
| 2011/0017256 A1 | 1/2011 | Stevens | |
| 2011/0041834 A1 | 2/2011 | Liao | |
| 2011/0058664 A1 | 3/2011 | Prax et al. | |
| 2011/0073161 A1 | 3/2011 | Scanlon | |
| 2011/0085322 A1 | 4/2011 | Myer | |
| 2011/0120523 A1 | 5/2011 | Silver | |
| 2011/0163222 A1 | 7/2011 | Moser | |
| 2011/0192460 A1 | 8/2011 | Tan | |
| 2011/0265840 A1 | 11/2011 | Sela | |
| 2012/0187222 A1 | 7/2012 | Galili | |

FOREIGN PATENT DOCUMENTS

| | | |
|---|---|---|
| CN | 202362621 U | 8/2012 |
| DE | 10320347 A1 | 12/2004 |
| EP | 0333706 A1 | 9/1989 |
| JP | S5979579 A | 5/1984 |
| JP | S59150484 A | 8/1984 |
| JP | S6213084 A | 1/1987 |
| JP | H09182459 A | 7/1997 |
| JP | H10308523 A | 11/1998 |
| JP | 3405035 B2 | 5/2003 |
| JP | 2003-199377 A | 7/2003 |
| JP | 2003197945 A | 7/2003 |
| KR | 20090010561 A | 1/2009 |
| WO | 2005076444 A1 | 8/2005 |
| WO | 2006022590 A1 | 3/2006 |
| WO | 2006078685 A2 | 7/2006 |
| WO | 2006130520 A2 | 12/2006 |
| WO | 2006071436 A3 | 1/2007 |
| WO | 2007/106519 A2 | 9/2007 |
| WO | 2008045335 A2 | 4/2008 |
| WO | 2008080088 A2 | 7/2008 |
| WO | 2008088311 A2 | 7/2008 |
| WO | 2008125915 A2 | 10/2008 |
| WO | 2008129089 A1 | 10/2008 |
| WO | 2008/144540 A1 | 11/2008 |
| WO | 2009038810 A1 | 3/2009 |
| WO | 2009/044982 A1 | 4/2009 |
| WO | 2009114730 A2 | 9/2009 |
| WO | 2010008927 A1 | 1/2010 |
| WO | 2010050993 A1 | 5/2010 |
| WO | 2010068706 A2 | 6/2010 |
| WO | 2010102256 A2 | 9/2010 |
| WO | 2010118236 A1 | 10/2010 |
| WO | 2010118503 A1 | 10/2010 |
| WO | 2010123538 A1 | 10/2010 |
| WO | 2011044641 A1 | 4/2011 |

OTHER PUBLICATIONS

G.R. Walker et al.; PV String Per-Module Maximum Power Point Enabling Converters; Sep. 28-Oct. 1, 2003; Proceedings of the Australasian Universities Power Engineering Conference; Christchurch, New Zealand.

(56) References Cited

OTHER PUBLICATIONS

J. L. Santos et al.; Maximum Power Point Tracker for PV Systems; Dec. 1-5, 2003; RIO 3—World Climate & Energy Event; Rio de Janiero, Brazil.

D. Ton and W. Bower; Summary Report of the DOE High-Tech Inverter Workshop; Jan. 2005.

PV Series Grid Tie Solar Inverters—Three Phase—North America; accessed at: xantrex.com/web/id/11/p/1/pt/23/product.asp on Feb. 3, 2010.

Long Island Power Authority Requirements for Interconnection of New Distributed Generation Units with Capacity of 300kVA or Less to be Operated in Parallel with Radial Distribution Lines (Date Unknown—before Jun. 19, 2006).

PCT/2008/058473 International Preliminary Report; 6 pages; dated Oct. 30, 2009.

PCT/2010/045352 International Search Report and Written Opinion; 12 pages; dated Oct. 26, 2010.

Clark, et al.; "Plug-n-Play, Reliable Power Systems for Nanosatellites"; Aug. 14-17, 2006; 20th Annual AIAA/USU Conference on Small Satellites; retrieved on May 21, 2008 from websitehttp://ssdl.stanford.edu/ssdl/images/stories/AA236/A06Fall/ARFC/ssc06-vi— 2.pdf.

"Solar Tracking System", Solazone, solar tracker, retrieved online on Aug. 19, 2011 from url: http://www.solazone.com.au/tracker.htm, 7 pages.

"Welcome to the next phase of solar", enphase Energy Brochure System Overview; retrieved Sep. 13, 2012 online from url: http://enphase.com/producs/microinverters ; copyright 2012, 3 pages.

May 16, 2014—European Search Report—EP 08732942.1.

Sep. 3, 2007—"Evaluation test results of a new distributed MPPT converter"—22nd European Photovoltaic Solar Energy Conference—R. Orduz, et al.

* cited by examiner

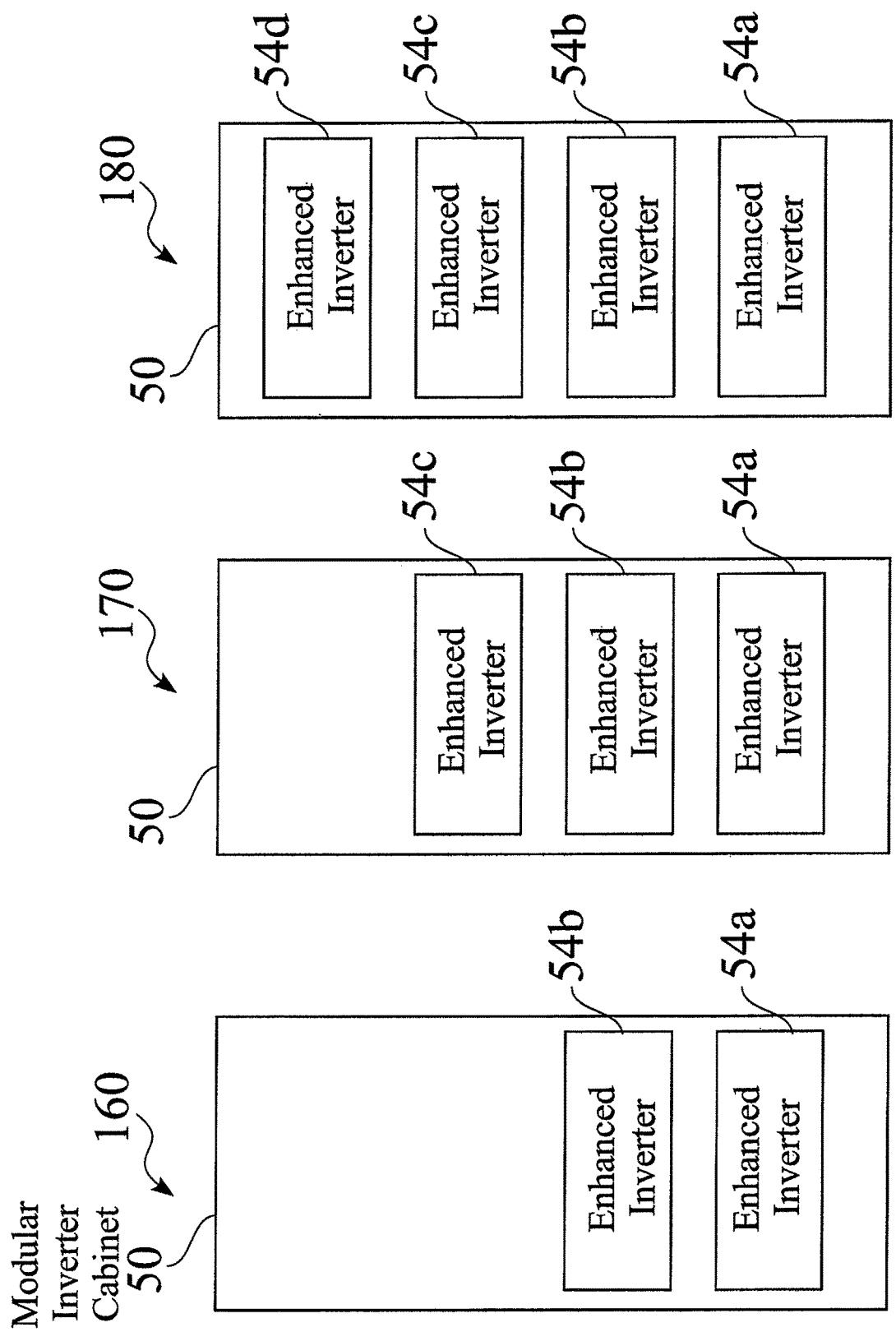

DISTRIBUTED MAXIMUM POWER POINT TRACKING SYSTEM, STRUCTURE AND PROCESS

CROSS REFERENCE TO RELATED APPLICATIONS

The present application is a continuation of U.S. application Ser. No. 15/722,310, entitled Distributed Maximum Power Point Tracking System, Structure and Process, filed 2 Oct. 2017, which is a Division of U.S. application Ser. No. 13/866,962, entitled Distributed Maximum Power Point Tracking System, Structure and Process, filed 19 Apr. 2013; which was a continuation of U.S. application Ser. No. 13/250,887, entitled Distributed Maximum Power Point Tracking System, Structure and Process, filed 30 Sep. 2011; which was issued as U.S. Pat. No. 8,427,009 on 23 Apr. 2013, which is a Continuation of U.S. application Ser. No. 12/842,864, entitled Distributed Maximum Power Point Tracking System, Structure and Process, filed 23 Jul. 2010, which was issued as U.S. Pat. No. 8,035,249 on 11 Oct. 2011; which is a Continuation of U.S. application Ser. No. 12/056,235, entitled Distributed Maximum Power Point Tracking System, Structure and Process, filed 26 Mar. 2008, issued as U.S. Pat. No. 7,772,716 on 10 Aug. 2010; which claims priority to U.S. Provisional Application No. 60/908,361, entitled Distributed Multiple Power Point Tracking, filed 27 Mar. 2007, which are each incorporated herein in their entirety by this reference thereto.

This Application is also related to PCT Application No. PCT/US08/58473, Distributed Maximum Power Point Tracking System, Structure and Process, filed 27 Mar. 2008, which claims priority to U.S. application Ser. No. 12/056,235, entitled Distributed Maximum Power Point Tracking System, Structure and Process, filed 26 Mar. 2008, issued as U.S. Pat. No. 7,772,716 on 10 Aug. 2010, which claims priority to U.S. Provisional Application No. 60/908,361, entitled Distributed Multiple Power Point Tracking, filed 27 Mar. 2007.

This Application is also related to PCT Application No. PCT/US10/45352, filed 12 Aug. 2010, entitled Enhanced Solar Panels, Liquid Delivery Systems and Associated Processes for Solar Energy Systems, which is a Continuation in Part of U.S. application Ser. No. 12/842,864, entitled Distributed Maximum Power Point Tracking System, Structure and Process, filed 23 Jul. 2010, which is a Continuation of U.S. application Ser. No. 12/056,235, entitled Distributed Maximum Power Point Tracking System, Structure and Process, filed 26 Mar. 2008, issued as U.S. Pat. No. 7,772,716 on 10 Aug. 2010, which claims priority to U.S. Provisional Application No. 60/908,361, entitled Distributed Multiple Power Point Tracking, filed 27 Mar. 2007.

PCT Application No. PCT/US10/45352, filed 12 Aug. 2010, entitled Enhanced Solar Panels, Liquid Delivery Systems and Associated Processes for Solar Energy Systems, also claims priority to U.S. Provisional Application No. 61/234,181, entitled Distributed Maximum Power Point Tracking System Structure, and Process with Enhanced Solar Panel Coating, Cleaning and Cooling, filed 14 Aug. 2009.

The Applicants hereby rescind any disclaimer of claim scope in the parent Application(s) or the prosecution history thereof and advises the USPTO that the claims in this Application may be broader than any claim in the parent Application(s).

FIELD OF THE INVENTION

The present invention relates generally to the field of power inverter systems. More particularly, the present invention relates to distributed power system structures, operation and control, and enhanced inverter systems, structures, and processes.

BACKGROUND OF THE INVENTION

Solar power is a clean renewable energy resource, and is becoming increasingly important for the future of this planet. Energy from the Sun is converted to electrical energy via the photoelectric effect using many photovoltaic cells in a photovoltaic (PV) panel. Power from a PV panel is direct current (DC), while modern utility grids require alternating current (AC) power. The DC power from the PV panel must be converted to AC power, of a suitable quality, and injected into the grid. A solar inverter accomplishes this task.

It would be advantageous to provide a structure, system and process to improve the efficiency of power inverters, such as for a solar panel system. Such a development would provide a significant technical advance.

To maximize the amount of power harvested, most solar inverters perform a maximum power point tracking (MPPT) algorithm. These algorithms treat an entire array of PV panels as a single entity, averaging all of the PV panels together, with a preference towards the weakest link.

It would therefore also be advantageous to provide a structure, system and process, to maximize efficiency and harvest capabilities of any solar PV system, to capitalize on profit and maximum return for the owner of the system.

Three specific examples of DC energy sources that currently have a role in distributed generation and sustainable energy systems are photovoltaic (PV) panels, fuel cell stacks, and batteries of various chemistries. These DC energy sources are all series and parallel connections of basic "cells". These cells all operate at a low DC voltage, ranging from less than a volt (for a PV cell) to three or four volts (for a Li-Ion cell). These low voltages do not interface well to existing higher power systems, so the cells are series connected, to create modules with higher terminal voltages. Paralleled modules then supply increased power levels to an inverter, for conversion to AC power.

These long strings of cells bring with them many complications. While the current exemplary discussion is focused on PV Panels, other power systems and devices are often similarly implemented for other sources of DC power.

A problem occurs when even a single cell in a PV array is shaded or obscured. The photocurrent generated in a shaded cell may drop to around 23.2% of the other cells. The shaded cell is reverse biased by the remaining cells in the string, while current continues to flow through the shaded cell, causing large localized power dissipation. This power is converted to heat, which in turn lowers the panel's output power capability. Bypass diodes, generally placed in parallel around each 24 cells (which may vary between manufacturers), limit the reverse bias voltage and hence the power dissipation in the shaded cell, to that generated by the surrounding half panel. However, all the power from that sub-string is lost, while current flows in the bypass diode. As well, the bypass diode wastes power from the entire string current, which flows through the panel. The output voltage of the entire string is also negatively affected, causing an even larger imbalance in the system.

Conventional module MPP currents may become unbalanced for other reasons. PV panels in a string are never identical. Because each PV panel in a series string is constrained to conduct the same current as the other PV panels in the string, the least efficient module sets the maximum string current, thereby reducing the overall efficiency of the array to the efficiency of this PV panel. For similar reasons, PV panels in a string are conventionally required to be mounted in the same orientation, and to be of identical size. This is not always possible or desirable, such as for aesthetic or other architectural reasons.

In standard solar array wiring, several series strings of solar panels are wired in parallel to each other to increase power. If there is an imbalance between these paralleled strings, current flows from the higher potential strings to the lower potential strings, instead of flowing to the inverter. Just as it is important to match the cells within a panel, it is also necessary to match the panels in a string, and then to match the strings, for maximum harvest from the solar array. If small fluctuations in environmental conditions occur, it can have a large impact on the system as a whole.

Solar inverters also "average" the entire array when they perform a conventional MPPT function. However, it is not a true average, since there is a preference that leans towards the weakest link in the system. This means that, even though some panels may be capable of supplying 100 percent of their rated power, the system will only harvest a fraction of that power, due to the averaging effect of the algorithm, and the current following through the weaker string, panel, and/or cells.

It would therefore be advantageous to provide a means for applying an algorithm that maximizes the harvest of power from a string, panel, and/or cells. Such an improvement would provide a significant advance to the efficiency and cost effectiveness of power cells structures, processes, and systems.

SUMMARY OF THE INVENTION

Distributed maximum power point tracking systems, structures, and processes are provided for power generation structures, such as for but not limited to a solar panel arrays. In an exemplary solar panel string structure, distributed maximum power point tracking (DMPPT) modules are provided, such as integrated into or retrofitted for each solar panel. The DMPPT modules provide panel level control for startup, operation, monitoring, and shutdown, and further provide flexible design and operation for strings of multiple panels. The strings are typically linked in parallel to a combiner box, and then toward an enhanced inverter module, which is typically connected to a power grid. Enhanced inverters are controllable either locally or remotely, wherein system status is readily determined, and operation of one or more sections of the system are readily controlled. The system provides increased operation time, and increased power production and efficiency, over a wide range of operating conditions.

BRIEF DESCRIPTION OF THE DRAWINGS

FIG. 15 is a block diagram of a modular power module housing having two sub-modules installed;

FIG. 16 is a block diagram of a modular power module housing having three sub-modules installed;

FIG. 17 is a block diagram of a modular power module housing having a four sub-module installed;

DETAILED DESCRIPTION OF PREFERRED EMBODIMENTS

Figure 1:
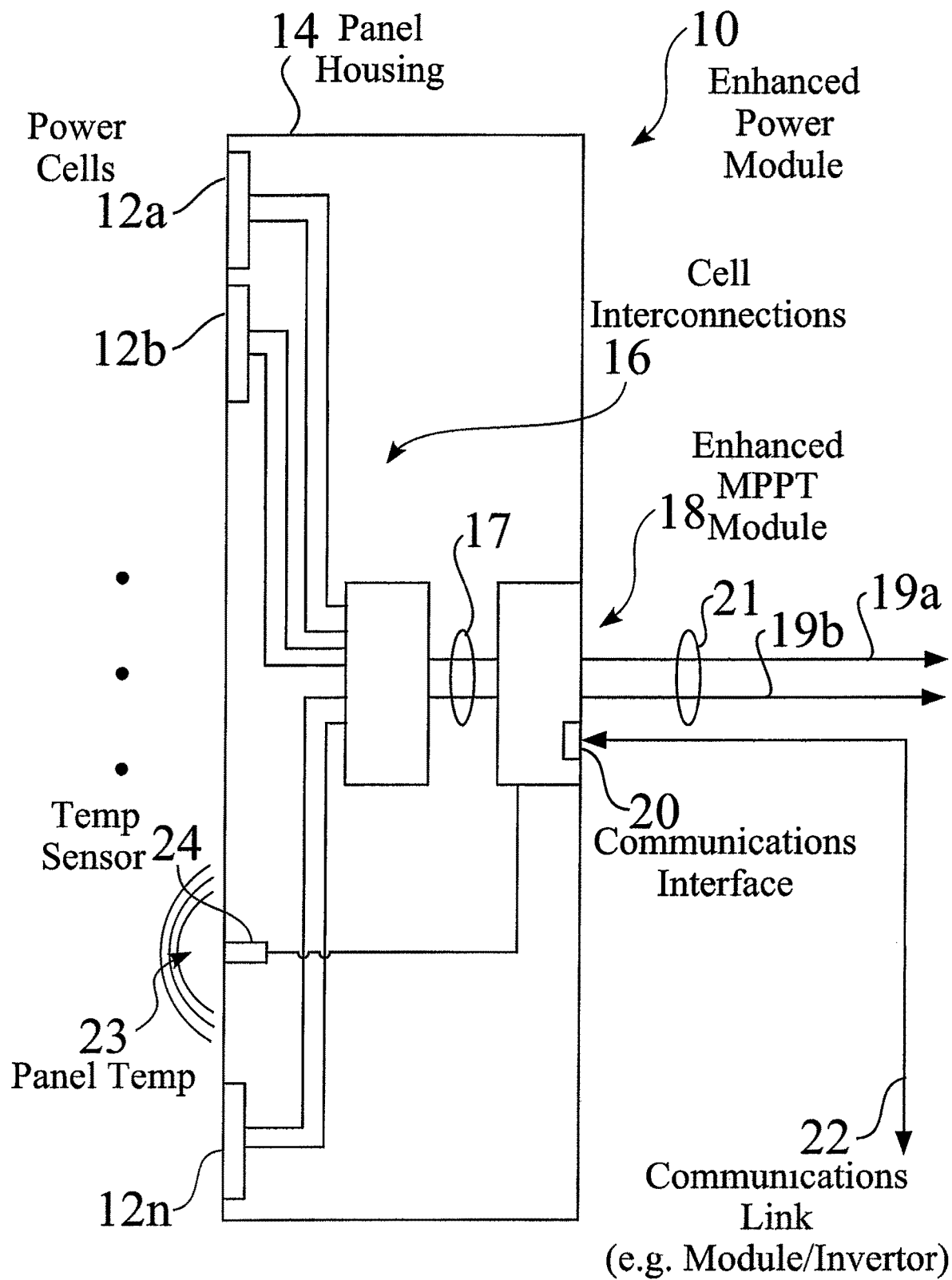
FIG. 1 is a schematic view of an exemplary enhanced power module comprising a plurality of power cells connected to a distributed maximum power point tracking module.
Figure 2:
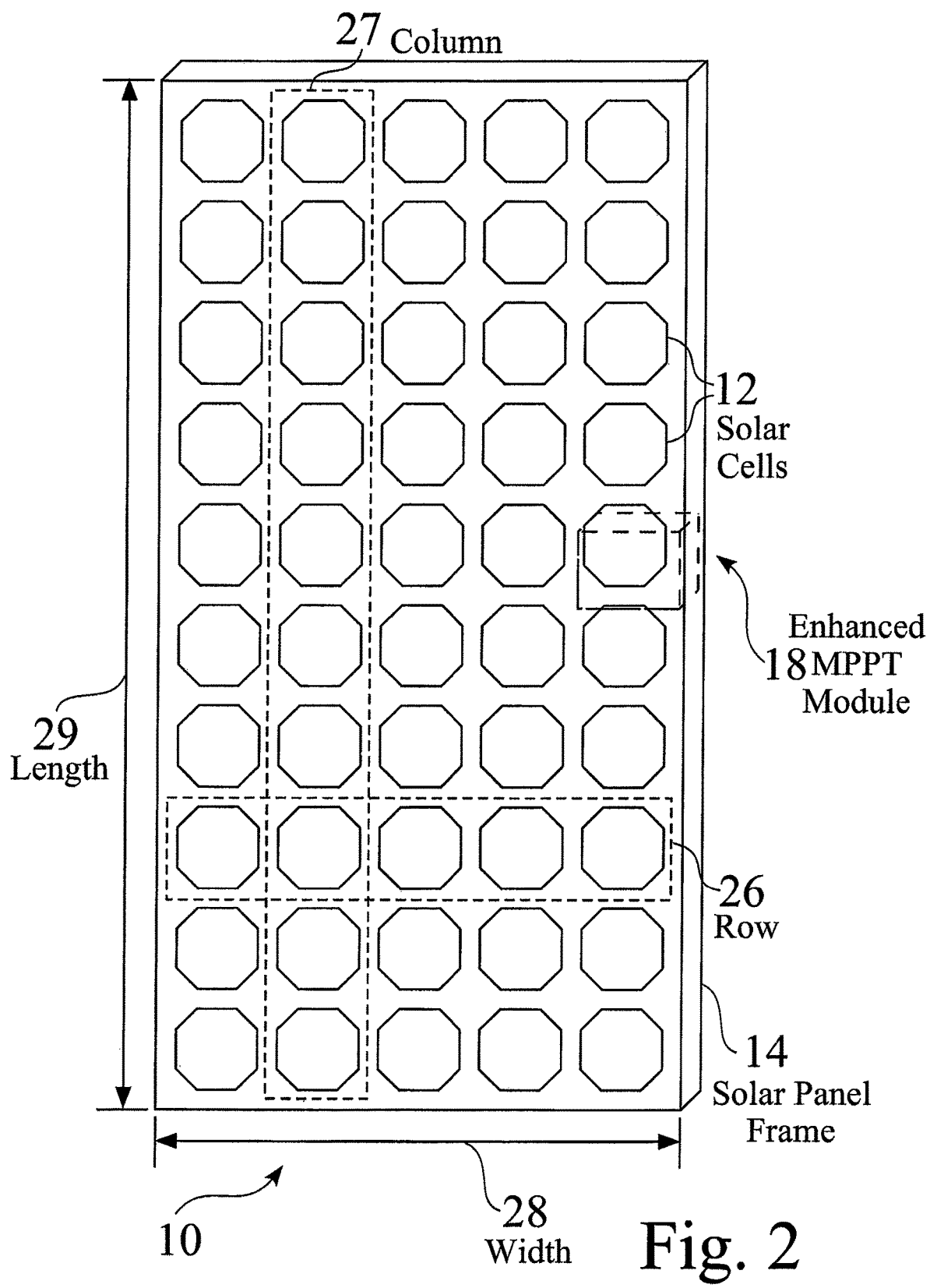
FIG. 2 is a schematic view of an exemplary enhanced solar panel comprising a plurality of solar cells and a distributed maximum power point tracking module.
Figure 3:
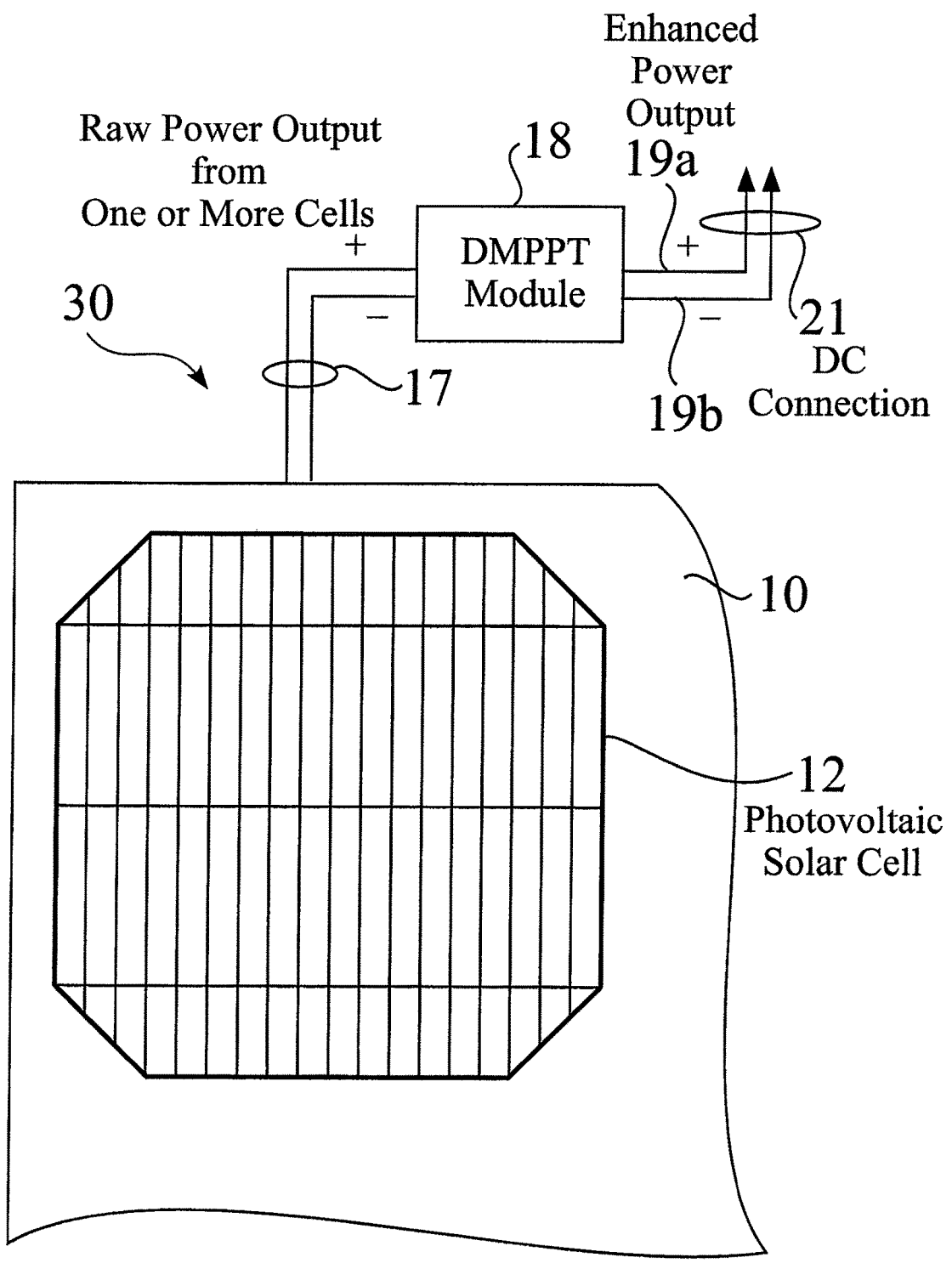
FIG. 3 is a schematic view of an exemplary photovoltaic solar cell having DC output power connections to a DMPPT module.
Figure 4:
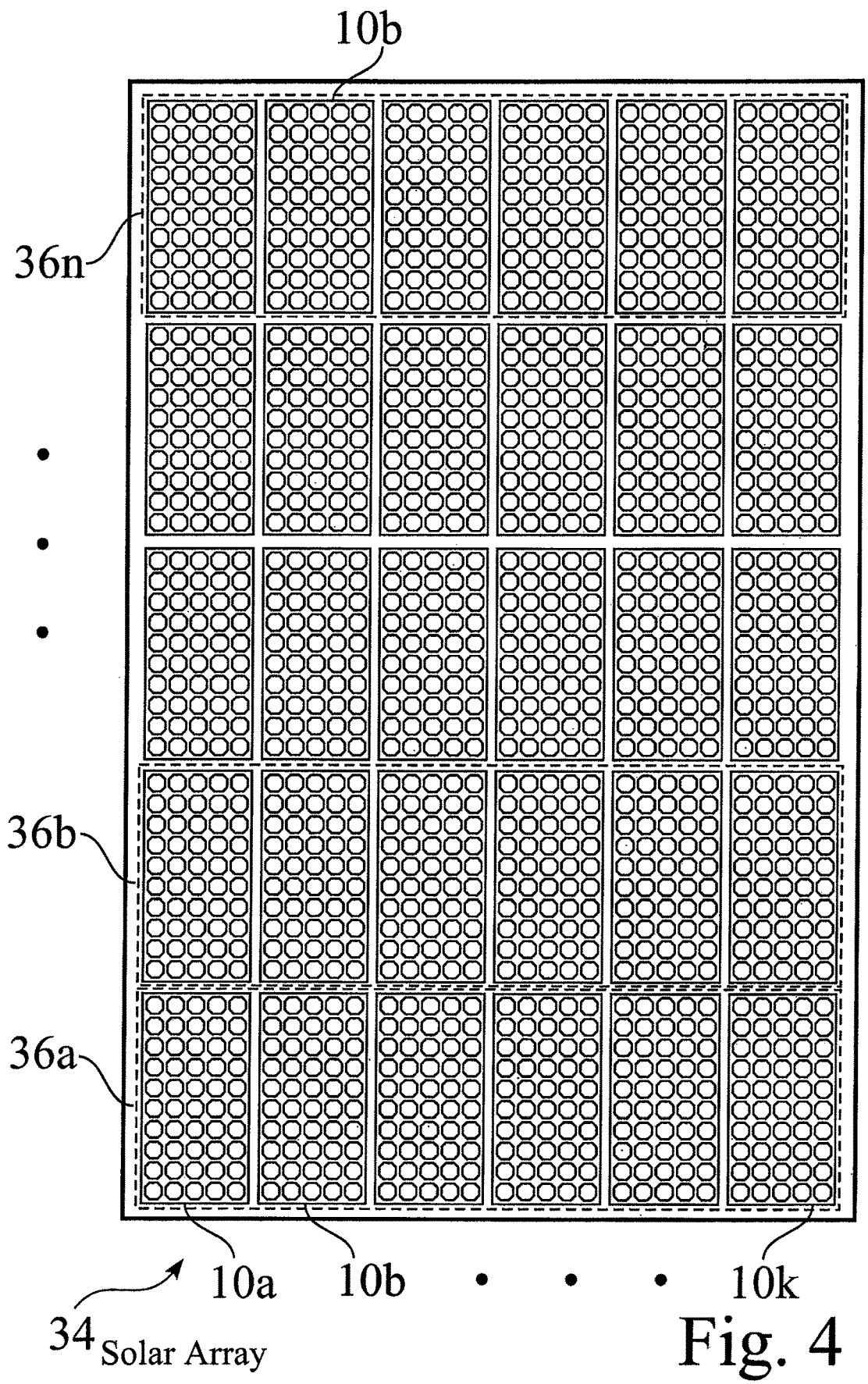
FIG. 4 is a schematic view of an exemplary solar array comprising a plurality of enhanced solar panels.

FIG. 1 is a schematic view of an exemplary enhanced power module 10 comprising a plurality of power cells 12, e.g. 12a-12n, such as but not limited to photovoltaic solar cells, fuel cells, and battery cells, connected 16,17 to a distributed maximum power point tracking (DMPPT) module 18. FIG. 2 is a schematic view of an exemplary enhanced power structure 10, e.g. an enhanced solar panel 10, comprising a plurality of solar cells 12 and a distributed maximum power point tracking module 18. FIG. 3 is a schematic view 30 of an exemplary photovoltaic solar cell having DC output power connections 17 to a DMPPT module 18. FIG. 4 is a schematic view of an exemplary solar array 34 comprising a plurality of enhanced solar panels 10, e.g. 10a-10k, arranged in a plurality of strings 36, e.g. 36a-36n.

The exemplary DMPPT module 18 seen in FIG. 1 has DC inputs 17, and a DC output 21, such as comprising a positive lead 19a and a negative lead 19b, The exemplary DMPPT module 18 also comprises a communications interface 20, and means for connection to a temperature sensor 24, such as responsive to a local panel temperature 23.

DMPPT modules 18, such as seen in FIG. 1, are preferably locally powered from the solar panel 10 that they are attached to, wherein each DMPPT module 18 draws its operating power from it's respective panel 10 that it is connected to, such as to reduce wiring and to improve efficiency.

DMPPT modules 18 are currently implemented for both new panels 10, i.e. at the point of manufacture, and for existing systems, wherein the DMPPT modules 18 may be retrofitted to existing panels 10. As also seen in FIG. 1, the external DC connection 21, comprising leads 19a,19b, is similar to the input DC connection 17, such as provided by an existing conventional panel. Therefore, wiring for the DMPPT modules is similar to conventional solar panels, which minimizes the learning curve for installation personnel.

The communications link 22 shown in FIG. 1 may be a wired connection or a wireless connection, such as to provide flexibility in design and installation. For example, the DMPPT module 18 can communicate via a wireless network, or through a wired connection, e.g. single twisted pair standard RS485 cable.

Some embodiments of either the wired or wireless style DMPPT modules feature a self-discovery function, such that when a new DMPPT module 18 is added to a system 40 (FIGS. 5, 6, 14), the system server 153 (FIG. 14) discovers the new module 18 over the communications link 22, and adds the new module 18 and associated panel 10 to the system 40.

As well, some embodiments of wireless style DMPPT modules 18 feature a self-healing function, wherein a DMPPT module 18 having a wireless communication link 22 also has the ability to bypass non-functioning devices or branches.

For example, if a DMPPT Module 18 is broken or removed, such as by a thief, in a wireless system 40, everything continues to function. The system 40 sees the "broken" device 18, and continues normal communications with the other DMPPT modules 18. This ensures continuous communications with the other active DMPPT modules 18 in the system 40. In a wired system, this may typically cause the loss of communications with several modules 18, as the communications line 22 could be damaged, broken, or cut. In addition to the DMPPT modules 18 and inverters 54, other devices may preferably be connected to the wireless network 22. If something should happen to one of these, it will not affect the system 40 as a whole. Therefore, some system embodiments 40 comprise a self-discovery module, such as provided through the server 153, built into the software. As well, the system 40 can be expanded to include utility monitoring and other applications.

In a conventional solar panel system, solar cells 12 are typically matched to make efficient solar panels, and solar panels are typically matched to make efficient solar arrays. In a conventional solar system, the output of a solar array having a plurality of conventional solar panels, i.e. without DMPPT modules 18, can never match the sum of the maximum power of the conventional solar panels, and the conventional panels can never match the sum of the maximum power of the solar cells 12. In additional to such inherit losses of power, environmental conditions, e.g. such as but not limited to the time of day, season, weather, location, panel positioning, panel age, and/or panel condition, further degrade the short-term and/or long term efficiency of such systems.

Figure 5:
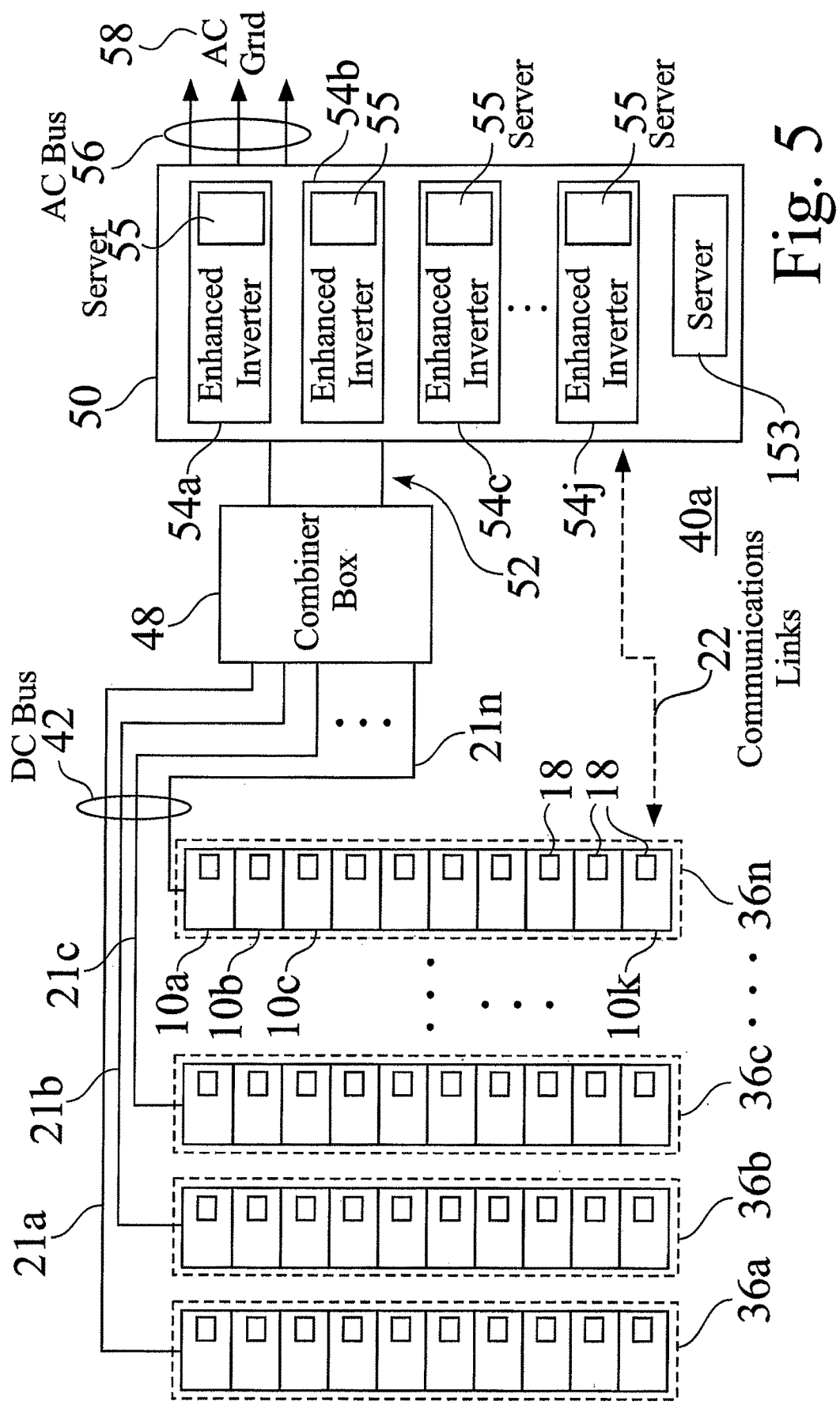
FIG. 5 is a schematic block diagram of an exemplary solar panel system having a plurality of strings of enhanced solar panels routed through a combiner box and controlled through a modular power module housing having one or more enhanced inverter modules.
Figure 6:
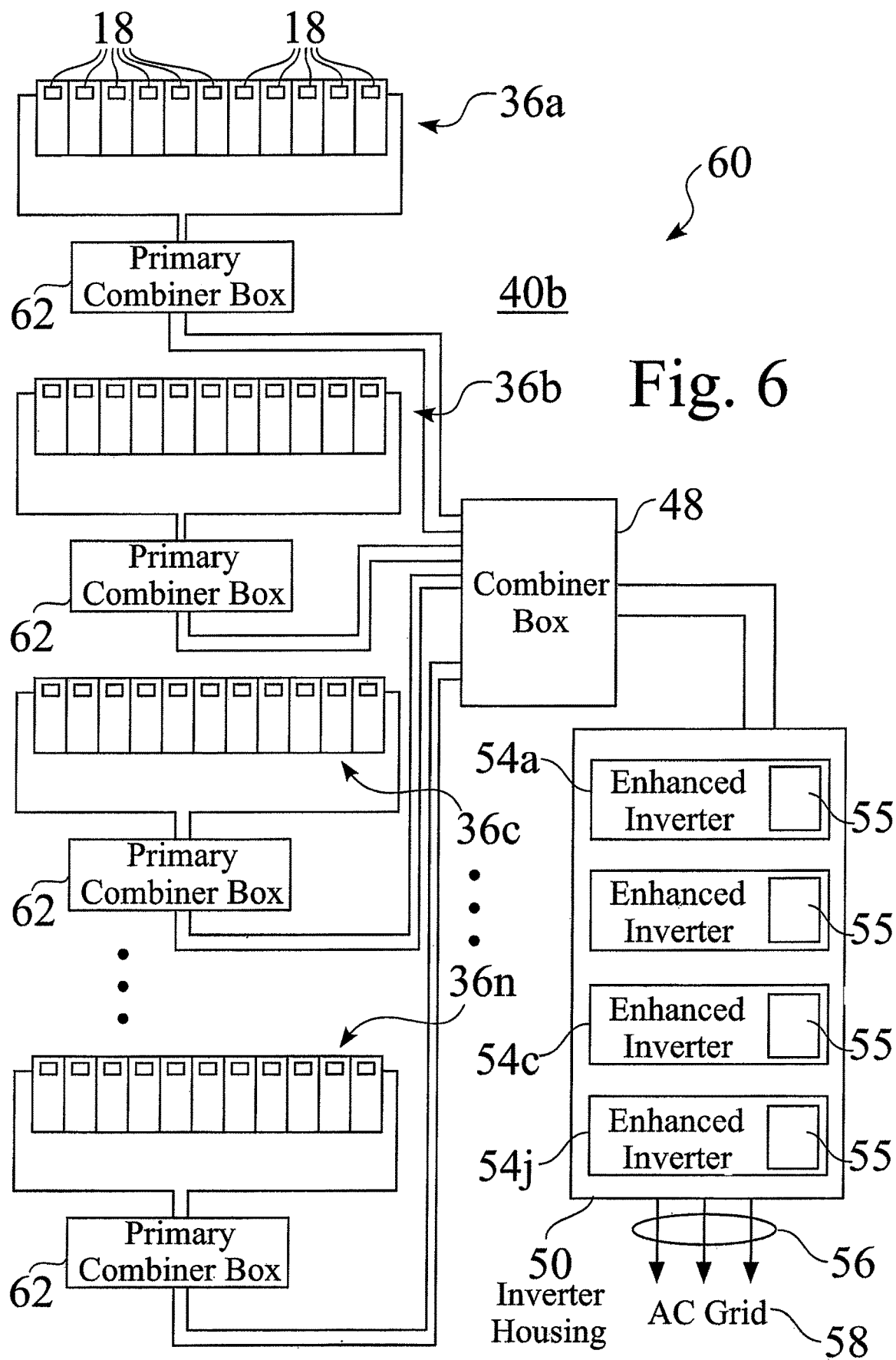
FIG. 6 is a schematic block diagram of an alternate exemplary solar panel system having a plurality of strings of enhanced solar panels having string-level combiner modules and routed through a combiner box and controlled through a modular power module housing having one or more enhanced inverter modules.

FIG. 5 is a schematic block diagram of an exemplary solar panel system 40, e.g. 40a, having a plurality of strings 36, e.g. 36a-36n, of enhanced solar panels 10, e.g. 10a-10k, routed through a combiner box 48 and controlled through a modular power module housing 50 having one or more enhanced inverter power modules 54, e.g. 54a-54j. FIG. 6 is a schematic block diagram 60 of an alternate exemplary solar panel system 40b having a plurality of strings 36, e.g. 36a-36n of enhanced solar panels 10 having string-level combiner modules 62, routed through a combiner box 48, and controlled through a modular power module housing 50 having one or more enhanced inverter power modules 54, e.g. 54a-54j.

Figure 7:
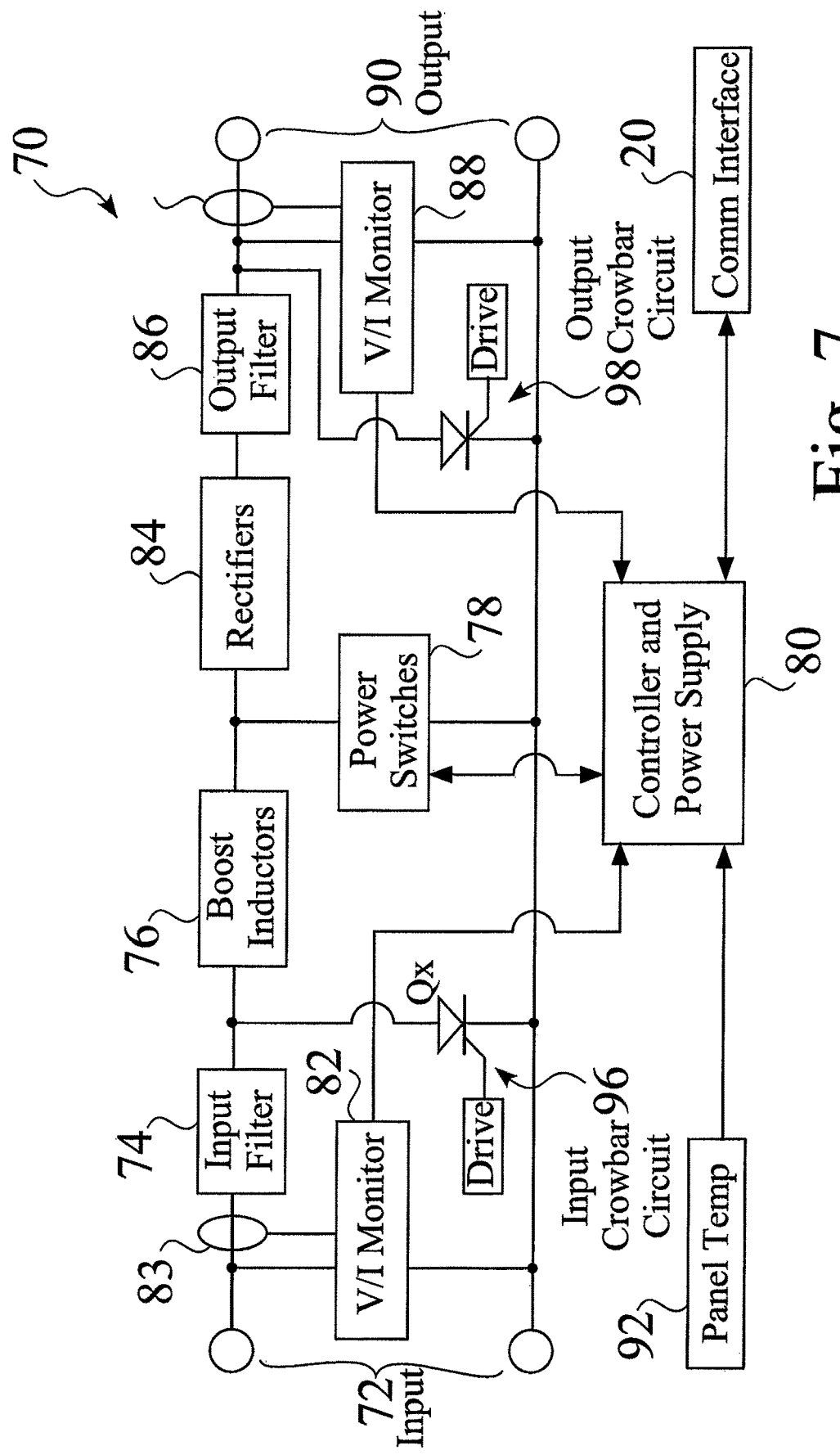
FIG. 7 is a block diagram of an exemplary distributed MPPT circuit.

FIG. 7 is a block diagram of an exemplary distributed MPPT circuit 70 for a distributed maximum power point tracker (DMPPT) module 18, which typically comprises an integrated or retrofitted module 18 for each enhanced solar panel 18. DMPPT modules 18 associated with the enhanced solar panels 10 overcome several problems inherent with conventional solar panels and the harvesting of power.

An input filter 74 is preferably attached to the input 72 of the DMPPT module 18, to help reduce EMI/RFI, as well as to supply protection from surges, etc. on the input side. This also helps in impedance matching between the solar panel 10 and the DMPPT module 18, such as to improve MPPT tracking.

The exemplary DMPPT module 18 shown in FIG. 7 preferably comprises one or more boost inductors 76, such as a dual inductively-coupled link inductor 76 to boost the efficiency of the DC-DC conversion stage. This has the added benefit of splitting the power path, which provides an increase in efficiency. At the present time, small inductor units 76 cost less and weigh less than a single inductor design, and there is less chance for core saturation. Another benefit of this design is the increased compensation factor. This allows a more stable distributed DC Bus 42,52 to be produced, with less requirements for DC-ripple and output filtering 86.

Some DMPPT embodiments 18 use a multi-phase approach, wherein the controller 80 can reduce the current flow through the power switch 78, thus increasing efficiency and reducing the heat dissipation load. This also allows the DMPPT 18 to improve power harvesting of the solar panels 10. The controller 80 controls the switching of these power devices 78 in a modified spread-spectrum switching scheme, to minimize EMI/RFI radiation of the modules 18. Low loss switching devices 78 are used to improve overall efficiency. In some embodiments 18, these switching devices 78 comprise transistors, FETs, MOSFETs, IGBTs, or any other power-switching device 78 that meets the design criteria.

Two diodes typically provide rectification 84 for the DMPPT modules 18, thus reducing the power dissipation and providing a plurality of paths for the power flow. The rectification diodes 84 also effectively isolate each DMPPT module 18 and associated solar panel 18 from the system array 30, in case of total panel failure. Even if a DMPPT module 18 fails, this isolation still exists, if it was not the diodes 84 or the output filter 86 that failed. This increases the reliability of the system 40 as a whole.

As seen in FIG. 7, a filter 86 is preferably attached to the output of the DMPPT modules 18, to help reduce EMI/RFI, and to provide protection, e.g. from surges, on the output side 90. The output filter 86 also helps to stabilize the distributed DC bus 42,52 that feeds the solar inverter(s) 54.

The controlled production of DC output voltage at the DMPPT modules 18, having a higher voltage than the incoming voltage from the panels 10, reduces power transmission losses from the array 36 to the inverter(s) 54. For example, for a higher voltage DC output that is also stabilized, to get the same amount of power from the array 36 to an inverter 54 requires less current, since the power loss in the conductors is given as $I^2R$, where I is the current over the conductors, and R is the resistance. Therefore, the lower current due to the higher voltage results in less line drop losses, and more power to the inverter(s) 54.

In addition, the inverters 54 run at better efficiency with a stable DC Distributed Bus 42,52. While other conventional inverters experience better efficiency with a higher DC Bus input, as long as it is within the design specifications, the DMPPT module 18 may preferably boost the distributed DC voltage from the array 36, to maximize this benefit.

Figure 8:
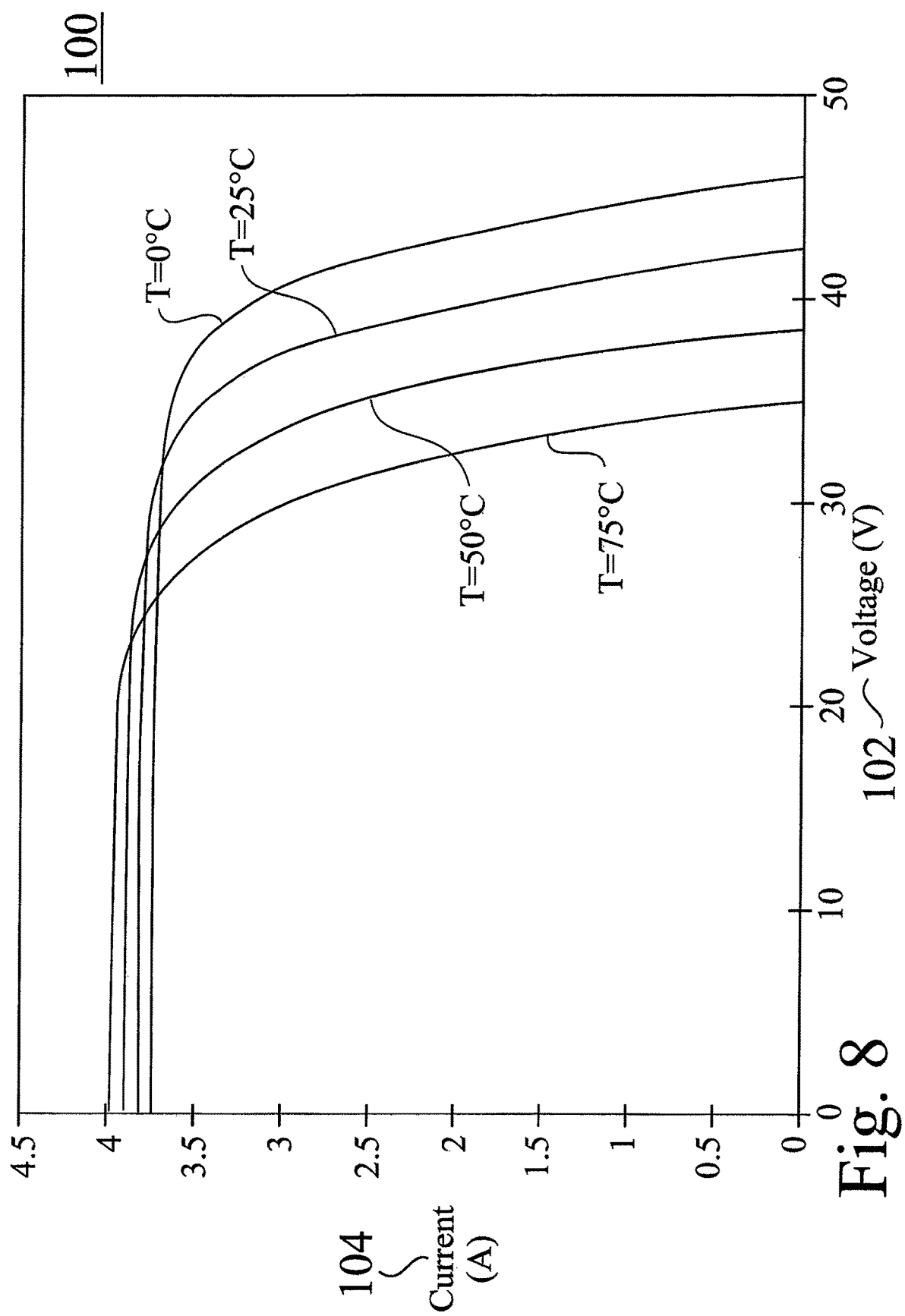
FIG. 8 is a first graph showing exemplary current-voltage (IV) curves of photovoltaic solar panels over a range of temperatures.
Figure 9:
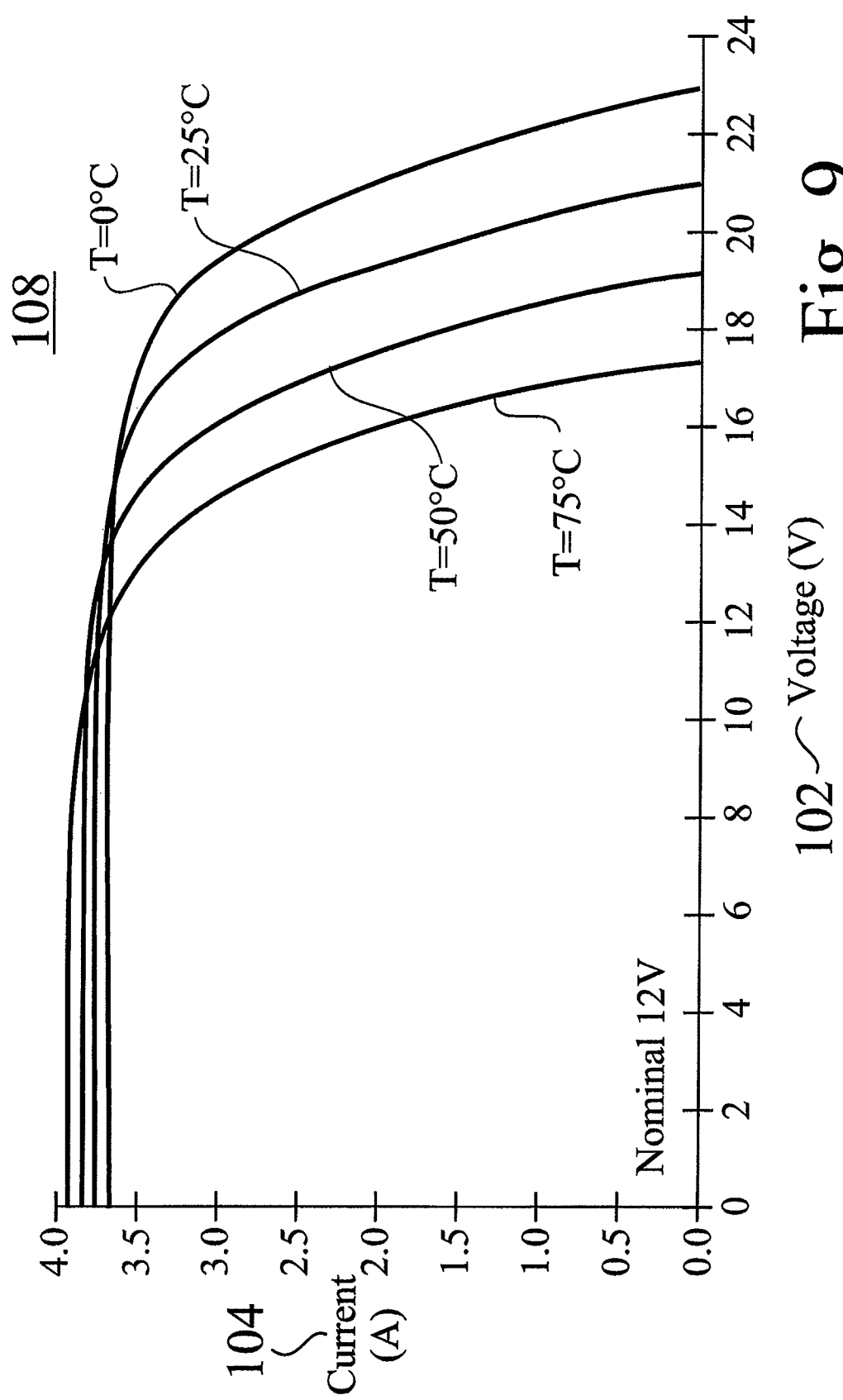
FIG. 9 is a second graph showing exemplary current-voltage (IV) curves of photovoltaic solar panels over a range of temperatures.

FIG. 8 and FIG. 9 show typical Current-Voltage (IV) curves of photovoltaic solar panels. These demonstrate how the voltage moves over a wider range than the current with temperature and solar radiation. The maximum power point for one or more panels moves during the day, and each panel experiences different environmental conditions, even within the same system. The distributed maximum power point tracking modules 18 and associated inverter system 40 provide several means to maximize the power output over a wide range of such conditions.

The panel temperature 23 (FIG. 1) is monitored and reported back to a server, such as an embedded server 153 associated with the inverter housing 50, or to a server 55 associated with a particular inverter 54. This temperature value is also used as an input to the multi-level MPPT controller 80 (FIG. 7). An op-amp may preferably be used to scale this value to be read by the controller 80, and is used as another control input to the controller 80 of the DMPPT module 18. In some embodiments of the DMPPT modules 18, a lead wire and temperature sensor 24 exit from the DMPPT Module 18 and attach to the panel 18. In alternate embodiments, a temperature sensor 124 is collocated with the DMPPT module 18, such as inside a panel junction box.

The embedded server 153 may preferably supply an ambient temperature, such as taken outside of the inverter cabinet 54, or outside a web server box, such as if another inverter is used at the site.

Figure 10:
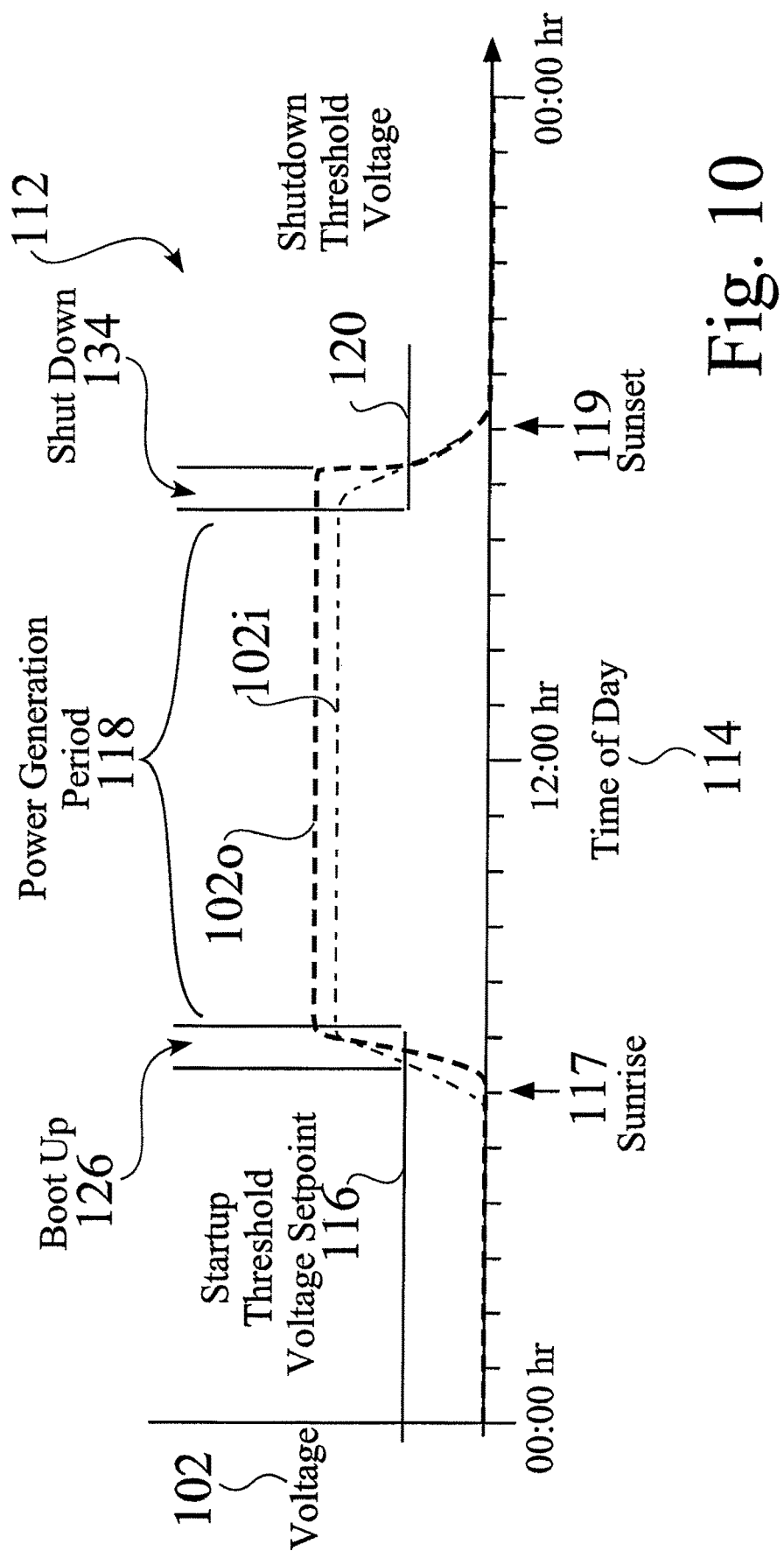
FIG. 10 is time chart of voltage output for an enhanced power module having DMPPT module.
Figure 11:
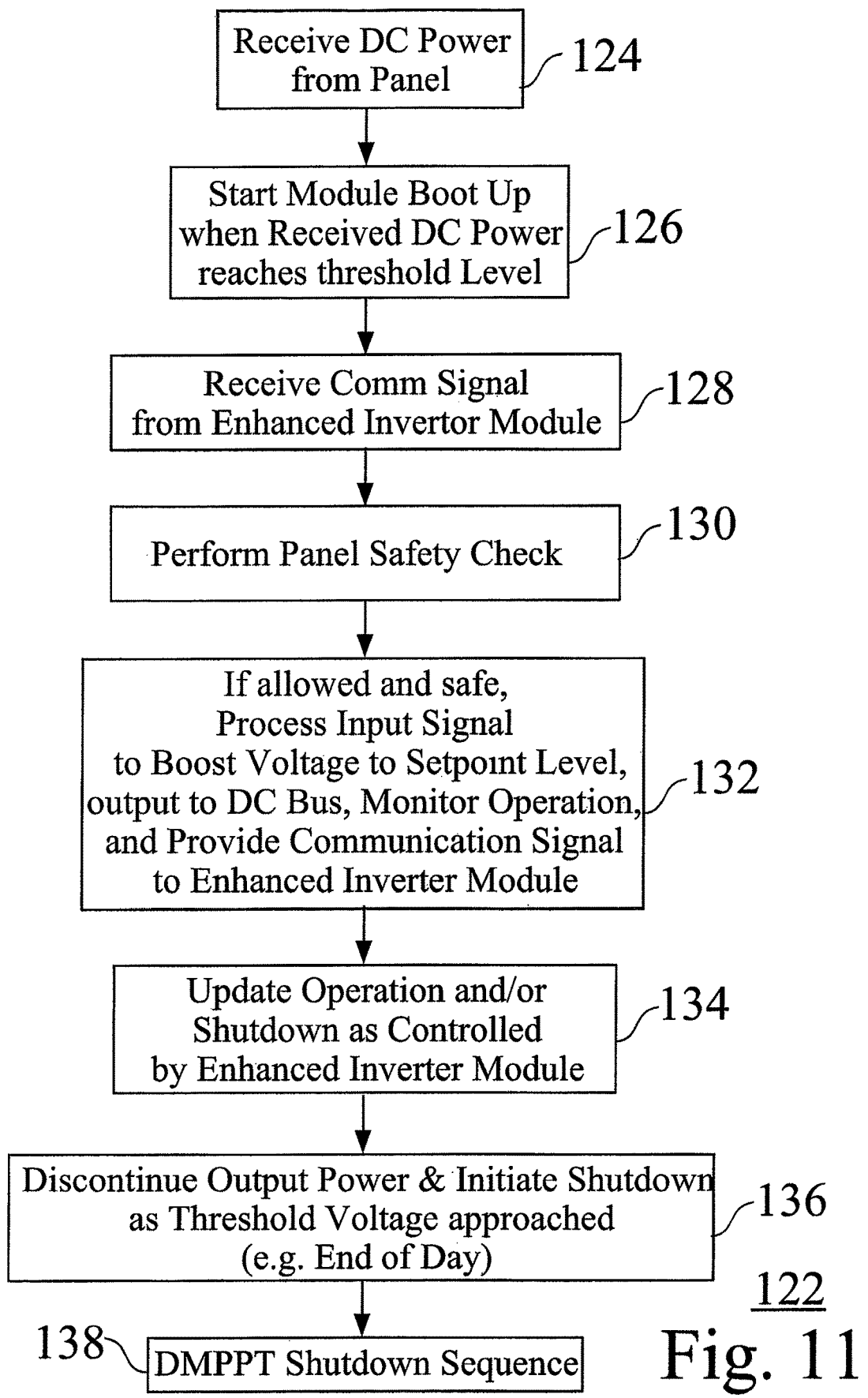
FIG. 11 is a flowchart of an exemplary operation of an enhanced power module having a DMPPT module.

Operation of Distributed Maximum Power Point Tracking Modules. FIG. 10 is time chart 112 showing operation states of the DMPPT 18, indicating DMPPT input voltage 102*i*, and output voltage 102*o* for an enhanced power module 10 having a DMPPT module 18. FIG. 11 is a flowchart of an exemplary process 122 for operation of an enhanced power module having a DMPPT module 18.

Figure 21:
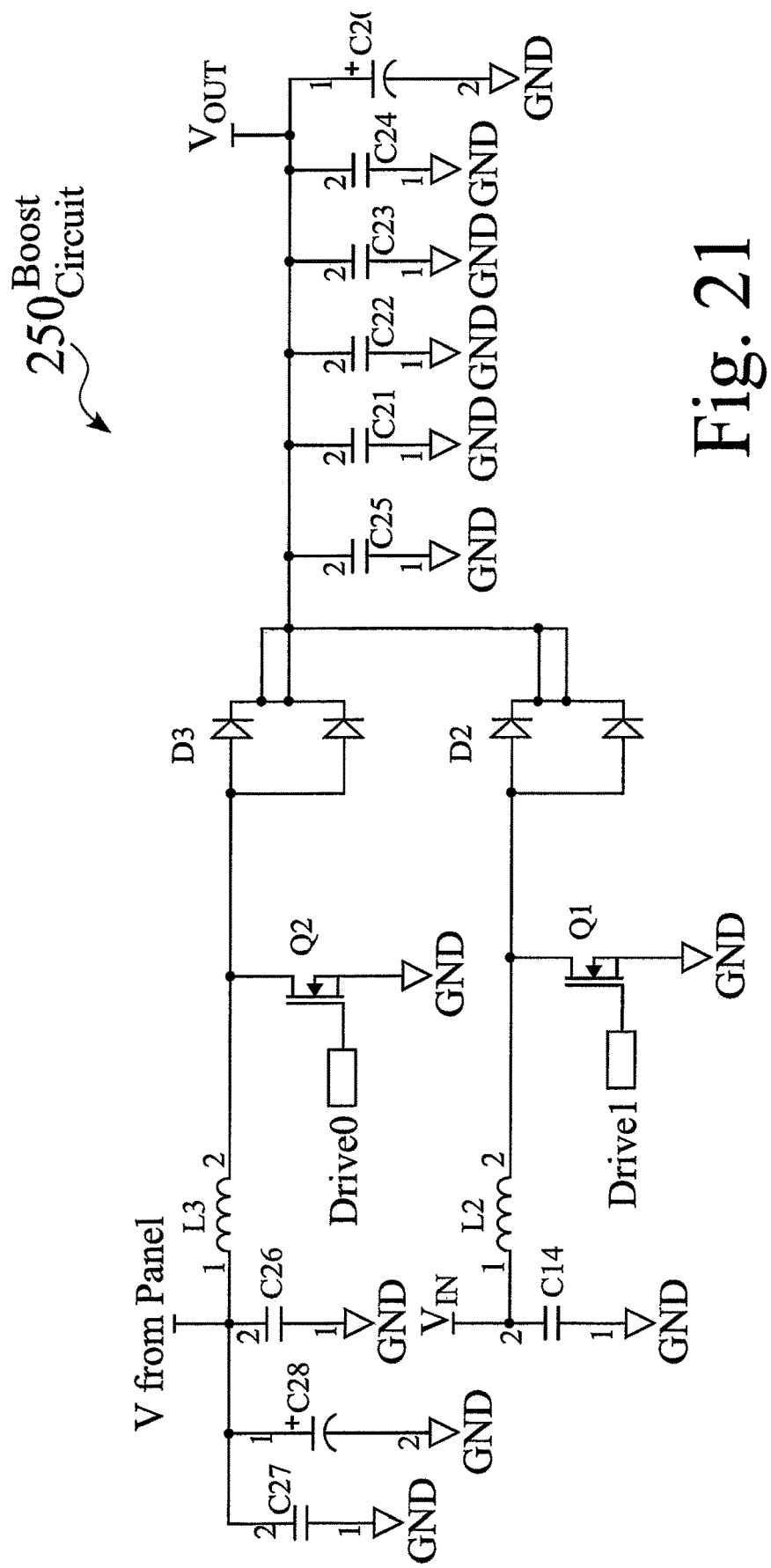
FIG. 21 is a schematic circuit diagram of an exemplary boost circuit for a DMPPT module.

As a solar panel 10 starts producing a voltage 102 and current 104 when light is shining on it, this power is transferred to the distributed bus 42 (FIG. 5) when it exceeds the voltage 102 to overcome the component drops and the forward voltage drop of the diode(s), such as shown in the diode circuits D2 and D3 seen in FIG. 21. In this regard, the system behaves like a conventional solar panel array structure. In some embodiments of solar panels 10 having DMPPTs 18, once the voltage on the solar panel 18 reaches a threshold voltage 116 (FIG. 10), e.g. approximately 4.5 to 6.5 Volts DC, the DMPPT Module 18 automatically wakes up 126 (FIG. 11), and starts performing the necessary checks 128,130, before switching over to RUN Mode 132.

As the voltage 102 of the solar panel 18 increases, the DMPPT 18 starts boosting the voltage 102 from the panel 18 to the common distribution bus 52 feeding the solar inverters 54. This wait is necessary to prevent the loss of control power from the controller circuit 70 (FIG. 7) when switching begins. By using control inputs, the system tracks the maximum power point of the solar panel 18, and boosts the voltage out to the distributed DC Bus 52 feeding the solar inverter(s) 54.

Since the voltage 102*i* is boosted 102*o*, the system as a whole reaches striking voltage for the solar Inverter 54 in a shorter period than a conventional array of panels 10 would without DMPPT Modules 18.

Furthermore, the system 40 as a whole operates longer before shutting down at the end of a power generation period 118, e.g. such as at sunset, dusk or evening 119 for externally mounted solar panels 18. Since the function of maximum power point tracking (MPPT) is performed at the panel level, several other issues associated with solar panels 10 are addressed as well.

Figure 29:
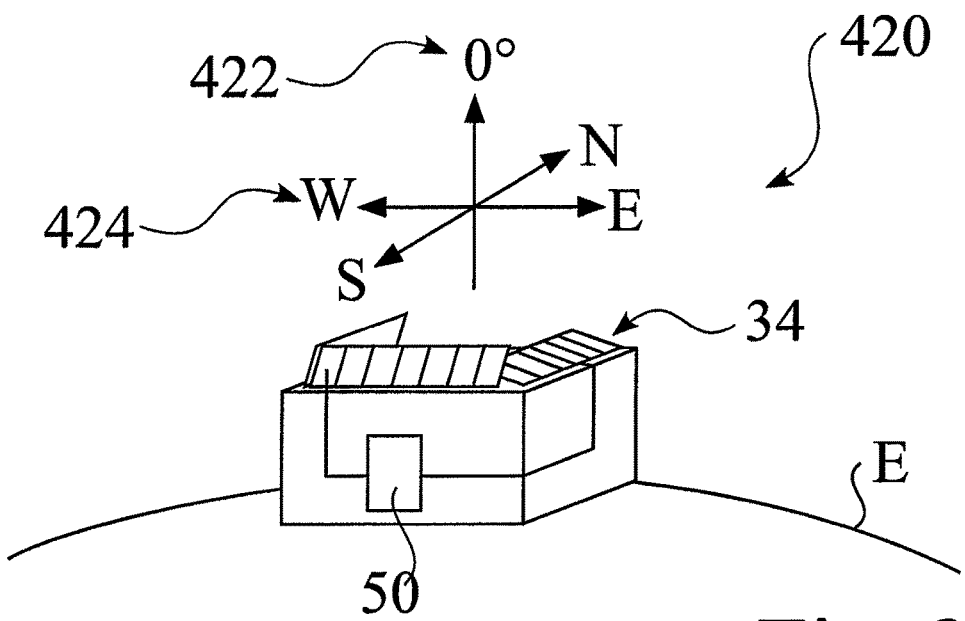
FIG. 29 shows an enhanced power harvesting system located on the Earth, wherein one or more panels within a string have different angles and/or orientations.

For example, problems with mismatched or different manufacturers can be eliminated with the DMPPT units 18. As seen in FIG. 29, solar panels 10 on different planes and orientations can be combined into the same system, without any de-rating or loss of harvest from the array 34. The overall efficiency of the array is increased, because the MPPT is done on a per panel basis, and not on the average of the entire system. In contrast to conventional solar systems, string mismatches are not an issue, due to the active nature of the DMPPT Modules 18. Conduction losses are reduced, thus allowing more energy to be harvested and transmitted to the inverter 54 for grid conversion. The overall efficiency of the array 34 is increased, because the panel output is processed, monitored, and controlled on a per panel basis, and not based upon the average of the entire string 36 or array 34. Safety features are built into the design for fire safety, monitoring, and several other future applications.

Overall, the DMPPT Module 18 addresses many of the current limitations of solar power, such as by providing longer harvest times with panel-level DMPPT modules 18, by providing "Early-On" and "Late-Off" for extended harvest times. Since the output from the solar panels 10 is boosted, the usable power is converted by the inverter 54, because the striking voltage is reached sooner and can be held longer, thereby resulting in an increase in harvestable power from each of the solar panels 10.

As well, some embodiments of the DMPPT modules 18 may preferably be reprogrammable or updatable, such as over the communications link 22, wherein different algorithms may be sent and stored within the DMPPT controllers 80, such as for modifying start up, operation, safety and shutdown operations.

DMPPT modules 18 also help to reduce the effects of partial shading on solar arrays 34. In conventional solar panels, partial shading of a single cell 12 causes the entire panel and string in which it is connected to reduce power output, and also increases loses due to string mismatch, by lowering the MPPT point for an entire solar array. In contrast to conventional panels, the DMPPT modules 18 can controllably compensate for partial shading at the panel level, to boost the DC output signal 102o.

Figure 12:
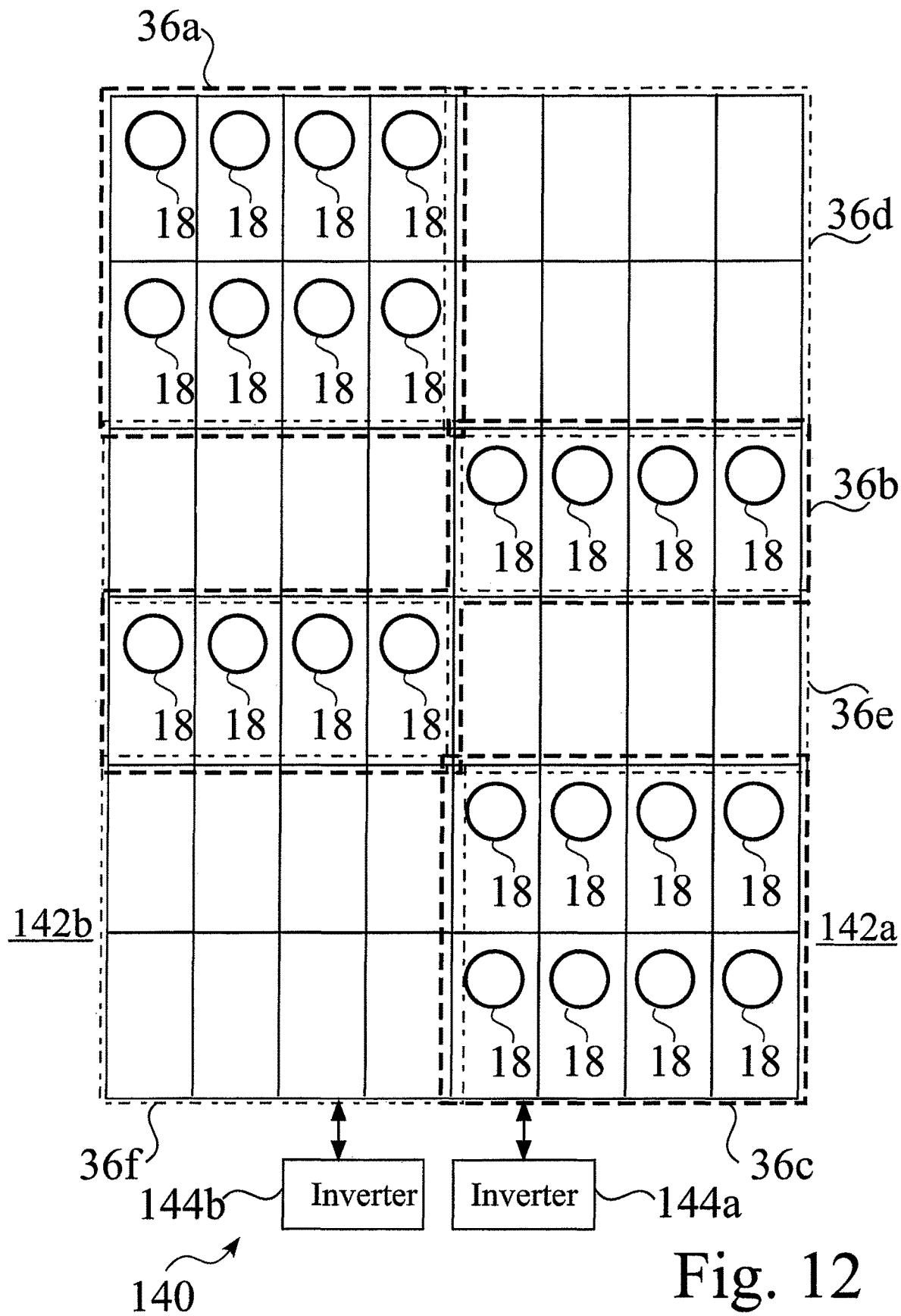
FIG. 12 is a schematic view of an exemplary solar array comprising a plurality of solar panels, wherein a portion of the panels in one or more strings further comprise DMPPT modules.

Test Platform. A test platform was installed to test the benefits and operation of the DMPPT modules 18. The test bed utilized forty-eight solar panels 10, rated at 170 watts, connected in six strings of eight 170-watt panels each. FIG. 12 is a schematic layout view 140 of the exemplary test bed solar array 34 comprising a plurality of solar panels 10, wherein a portion of the panels in one or more strings further comprise DMPPT modules 18. A first group 142a comprising three strings 36a,36b and 36c having different sample orientations across the array 34 included DMPPT modules 18, while a second group 142b comprising three strings 36d,36e and 36f having different sample orientations across the array 34, did not include DMPPT modules 18.

The system was connected to two identical conventional solar inverters 144, e.g. 144a,144b for connection to a public AC grid, wherein the first string group 142b was fed into the first conventional inverter 144a, and the second string group 142b was fed into the second conventional inverter 144b. In the test platform 140, each of the conventional solar inverters 144a,144b was rated at 4,080 Watts Peak DC.

Figure 13:
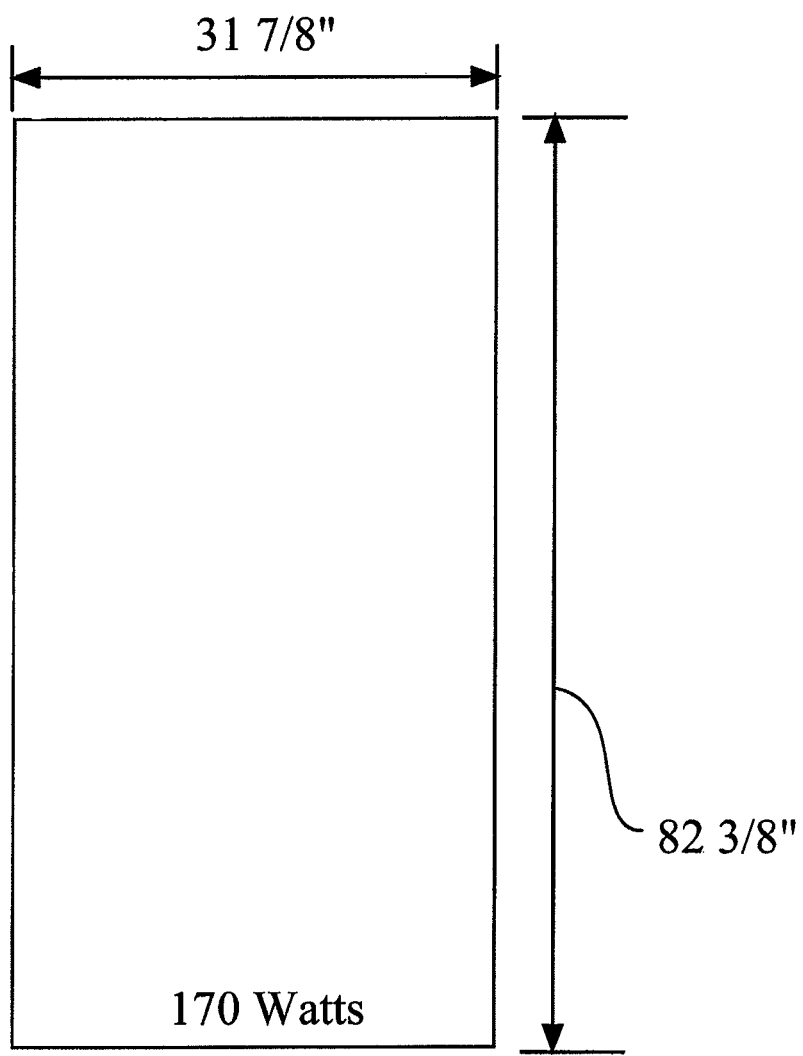
FIG. 13 shows the relative proportion and size of an exemplary solar array having a capacity of approximately 170 W, comprising a plurality of enhanced solar panels, wherein a portion of the panels in one or more strings further comprise DMPPT modules.

FIG. 13 shows the relative proportion and size of an exemplary solar array having a capacity of approximately 170 W, comprising a plurality of enhanced solar panels, wherein a portion of the panels in one or more strings further comprise DMPPT modules 18.

The panels on the test bed are laid out to give a fair representation of solar illumination. One half of the panels are modified with the DMPPT modules 18, while the other half of the panels are left unmodified, i.e. standard solar panels. Each set feeds into a similar sized solar inverter from the same manufacturer. Data is to be gathered over a period of time to evaluate specific design parameters for the DMPPT modules 18. Since the strings 36 are set adjacent to each other, shading can be introduced upon the system, such as by using cardboard cutouts and sliding them over the top the solar panels 10.

Figure 14:
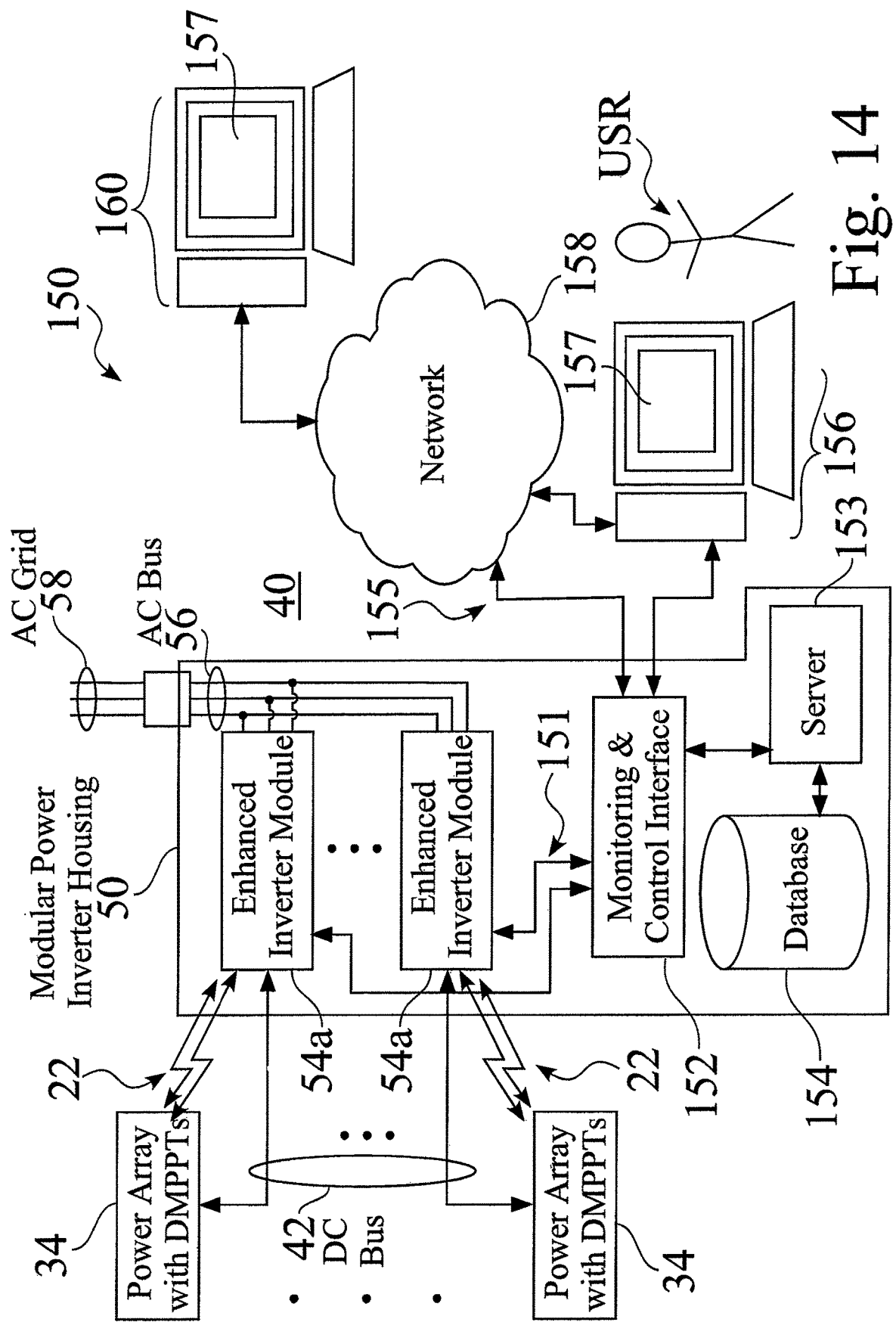
FIG. 14 is a block diagram of a modular power module housing having one or more enhanced inverter modules, a central interface, and connectable to one or more local or remote monitoring or control devices.

Enhanced Inverter System Operation and Monitoring. FIG. 14 is a block diagram of an exemplary system 40 comprising a modular power inverter housing 50 housing having one or more enhanced inverter modules 54, e.g. 54a-54j, a central interface 152, a database 154, and connectable 155 to one or more local or remote monitoring or control devices 156,160, such as for interaction with a user USR.

In some system embodiments, the modular power inverter housing 50 is powered by the AC bus 56, e.g. such as by the AC grid 58, wherein the housing 50 may be powered by a public AC grid 58 even when the power array(s) 34 are down. In other system embodiments 40, the modular power inverter housing 50 is powered by the DC bus 42, 52 e.g. such as by the solar arrays(s) 34, wherein the housing 50 may be powered off-grid, even when the AC grid 58 is down.

In some alternate system embodiments, the modular power inverter housing 50 is powered either off-grid 42,52 or on-grid 58, such as depending on available power.

As seen in FIG. 14, a central monitoring and control interface 152 interacts with each of the inverters 154, e.g. the enhanced inverters 54a-54j. Each of the enhanced inverters 54 preferably comprise a dedicated server 55 (FIG. 5, FIG. 6), e.g. an embedded web server 55, or may communicate with a system server 153, e.g. an embedded system server 153, associated with the inverter housing 50.

The data collected from the power panels 10, e.g. the solar panels 10, the enhanced inverters 54, e.g. solar inverters 54, and other equipment with the system 40, can be displayed in near real-time, such as through a local device 156 or remote device 160, e.g. over a network 158, such as but not limited to a local area network (LAN) a wide area network (WAN), or the Internet. This collected data can also be sent, such as through a server 153, and logged into a database 154. The exemplary system 40 seen in FIG. 14 may therefore preferably provide detailed trending analysis and/or performance tracking over the lifetime of the system. The system server 153, e.g. an embedded web server 153, typically gathers information and provides presetting of controls for the entire system 40, right down to the individual panels 10, through communication links 22 to panel DMPPT modules 18.

The DMPPT module controller 80 (FIG. 7), e.g. such as comprising a digital signal processor 80, typically outputs data in a slave mode, such as by reporting data back to an associated embedded server 54 when requested, through one of several means, e.g. such as but not limited to wired or wireless transmission 22. The controller 80 also typically accepts measured parameters from the embedded controller 54 pertaining to the local ambient temperature 25 (FIG. 1) and the solar insolation, i.e. the intensity of incident solar radiation These parameters, along with the data collected at the panel 10, provide control inputs to the program performing the MPPT function on a distributed, i.e. local panel, level.

In some system embodiments 40, the communication links 22 between the DMPPTs 18 and the embedded server(s) 153,55 comprise either a multi-drop single twisted pair RS-485 communications line 22, or a wireless radio link 22. In some system embodiments, the use of wireless communication links 22 may be preferred, such as to reduce the wiring cost, thereby reducing the overall cost of the system 40.

In some embodiments, the protocol used for the communication links is ModBus, such as RTU RS485 for the wired system, or a wireless tree mesh system with self-healing/discovery capabilities for wireless communication links 22. Such ModBus protocols are preferably designed for harsh environments, minimizing or eliminating lost packets of data.

All distributed data is gathered and passed 22, e.g. via the RS-485 ModBus links 22, and then the embedded server 54 at the inverter cabinet 50 formats this into a viewable web page 157 (FIG. 14) for the user USR. This collected data can also be streamed out to another server, e.g. 156,160 for data logging and trending applications.

The heartbeat signal rides on the universal broadcast address, and this synchronizes all of the panels 10 within a few microseconds of each other for their operation. Another defined address broadcasts the ambient temperature and solar insolation from the server 153 to each of the DMPPT Modules 18. If communications are lost, or if a "Fire" signal is broadcasted, then the DMPPT Modules 18 automatically shut down, to remove high voltage from their input 72 and output 90.

Modular Design of Solar Inverter Units. FIG. 15 is a block diagram of a modular inverter housing 50, such as a Model No. ASPM-2-70KW, available through Accurate Solar Systems, Inc. of Menlo Park Calif., having two 35 KW enhanced inverters 54 installed, such as a Model No. ASPM-1-35KW, available through Accurate Solar Systems, Inc. of Menlo Park Calif., having a total rating of 70 KW. FIG. 16 is a block diagram of a modular inverter housing 50 having three 35 KW enhanced inverters 54 installed, e.g. Model No. ASPM-1-35KW, rated for 105 KW. FIG. 17 is a block diagram of a modular inverter housing 50 housing having four 35 KW enhanced inverters 54 installed, e.g. Model No. ASPM-1-35KW, rated for 140 KW. While the exemplary enhanced inverters 54 described above are rated at 35 KW each, some alternate embodiments of the enhanced inverters are rated 4 kilowatts each, wherein the system 40 can operate even closer throughout the day.

The modular inverter housing 50 may preferably house a plurality of inverters 54, to reduce cost, increase efficiency, and improve performance of the system 40. As well, the use of a modular enhanced inverter 54, such as but not limited to a 35 kW inverter 54, is readily combined or stacked to provide a wide variety of capacities for a system 40, such as for a 35 kW system, a 70 kW system 40, a 105 kW system 40, or a 140 kW system 40, which may be housed in one or more types of modular inverter housings 50.

Each cabinet 50 typically comprises associated transformers, output circuitry, input circuitry, and communications 151 with the embedded web server 153. The smallest current cabinet 50 houses a single 35 kW module 54. The next step is a larger cabinet 50 that houses between two and four of 35 kW enhanced inverter modules, depending on the power required.

In the modular inverter housing systems 50, such as seen in FIG. 15, FIG. 16 and FIG. 17, if an enhanced inverter 54 goes down, the others continue to deliver power to the AC bus 58. Therefore, a single fault will not bring the entire system 40 down. The enhanced inverter units 54 communicate with each other, such as through the embedded web server 153.

In some system embodiments 40, one of the enhanced inverters 54 initially comes on as the system 40 starts up, such as to increase efficiency. As the available power increases, the next enhanced inverter unit 54 is signaled to come online, and so on, such that the system 40 operates at near peak efficiency for as much time as possible, thereby providing more system up time in larger systems. Therefore, in some system embodiments 40, the use of multiple enhanced modules 54 wastes less energy, as the system 40 only turns on inverters 54 that can be supported by the array 34.

In the modular inverter housing systems 50, such as seen in FIG. 15, FIG. 16 and FIG. 17, each of the enhanced inverter modules 54, e.g. such as but not limited to being rated at 4 kW or 35 kW apiece, may preferably be hot swappable.

Advanced Diagnostics and Monitoring of Enhanced Power Systems. Since embedded web servers 153,55 communicate with the solar inverters 54, the solar panels 10, and any other associated equipment, the system 40 may preferably provide a near real-time view of the current status of the system 40 as a whole. If a problem occurs, then the operator USR is notified by various means, e.g. such as through the user interface 157.

Most conventional solar power inverter systems typically provide a single DC input voltage and a single current measurement at the inverter level, which is based upon the sum of an entire array. In contrast, while the enhanced power inverter system 40 provides the current, voltage, and power of each of the arrays 34, the enhanced power inverter system 40 may preferably provide the status and performance for each individual panel 10 and string 36, such that troubleshooting and maintenance is readily performed.

Figure 18:
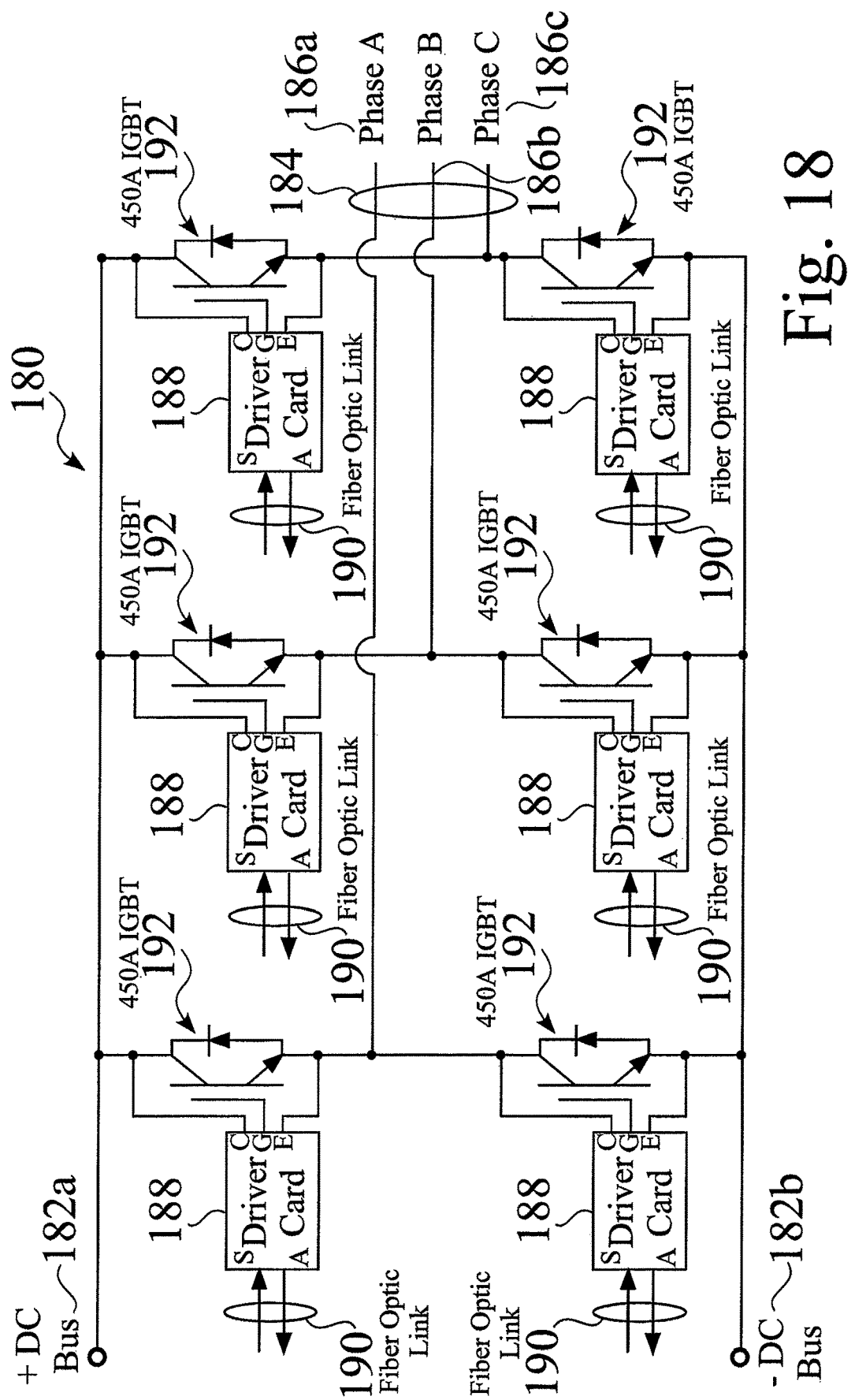
FIG. 18 is a simplified schematic circuit diagram of an exemplary power section for an enhanced inverter module.

Smart Switching Technology. FIG. 18 is a simplified schematic circuit diagram of an exemplary power section 180 for an enhanced inverter module 54, wherein the enhanced inverter 54 uses a three-phase half bridge IGBT driven power stage, such as provided with IGBTs 192, driver cards 188, and fiber optic links 190.

Most conventional inverter systems use a standard high frequency pulse width modulation (PWM) method that, while it performs basic signal inversion, has many inherent disadvantages.

Figure 19:
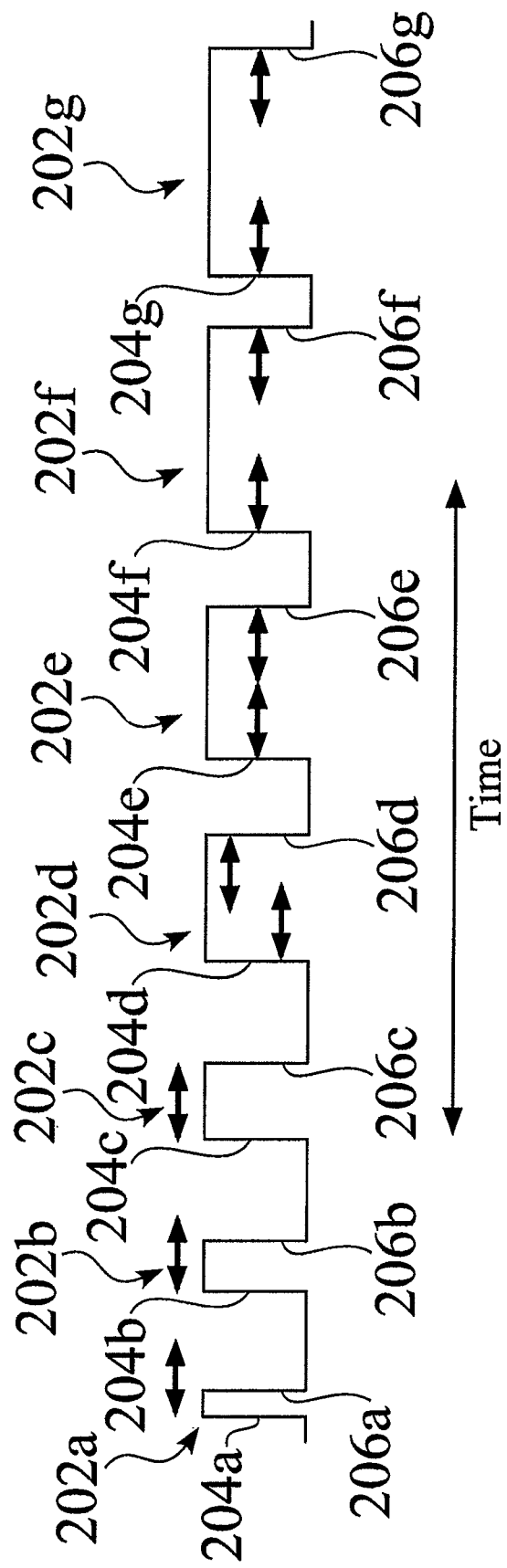
FIG. 19 shows resultant output power signal properties for active elimination of harmonics by inverter signal modification using sine-weighted pulses.

FIG. 19 shows a resultant output power signal pulse train 200, based upon active elimination of harmonics by an enhanced inverter module 54, wherein the power signal is processed using sine weighted pulses. In the enhanced pulse width modulation (PWM) provided by the enhanced inverter system 54, some of the edges, e.g. 204,206, are dynamically linked to other edges in the firing sequence. This has the benefit of simplifying the overall inverter 54, as well as actively eliminating all third harmonics. The enhanced inverter system 54 reduces or eliminates harmonics, by controlling where the rising edges 204 and falling edges 206 of the pulse train 200 occur.

Combining these two features, it is possible to generate a modified smart switching PWM signal 200 that has very low harmonic content, a lower carrier switching speed, and improved efficiency. This switching scheme 200 allows a relatively simple filter 356 (FIG. 26) to be used, which reduces weight and cost, and improves efficiency. The cutoff point for the filter 356 is preferably designed for the nineteenth harmonic, thus improving vastly over conventional pulse width modulation methods. For example, for an enhanced 35 kW inverter design, the power savings from switching alone ranges from about 650 Watts to 1 kW of power.

For example, the following equation provides the third harmonics of a seven pulse modified PWM waveform, as shown:

$$H03 = (\cos(p1s*3*pi/180) - \cos(p1e*3*pi/180) + \cos(p2s*3*pi/180) - \cos(p2e*3*pi/180) + \cos(p3s*3*pi/180) - \cos(p3e*3*pi/180) + \cos(p4s*3*pi/180) - \cos(p4e*3*pi/180) + \cos(p5s*3*pi/180) - \cos(p5e*3*pi/180) + \cos(p6s*3*pi/180) - \cos(p6e*3*pi/180) + \cos(p7s*3*pi/180) - \cos(p7e*3*pi/180) + 0)/(a01*3);$$

where "a01" is the power of the fundamental waveform, p stands for pulse, the number next to p indicates the number of the pulse, s stands for the start of the pulse, and e stands for the end of the pulse, e.g. p1s indicates the start of the first pulse, and p1e indicates the end of the first pulse. Also, the first three pulses and the ending fifth pulse are linked to the others, to eliminate the third harmonics.

Figure 26:
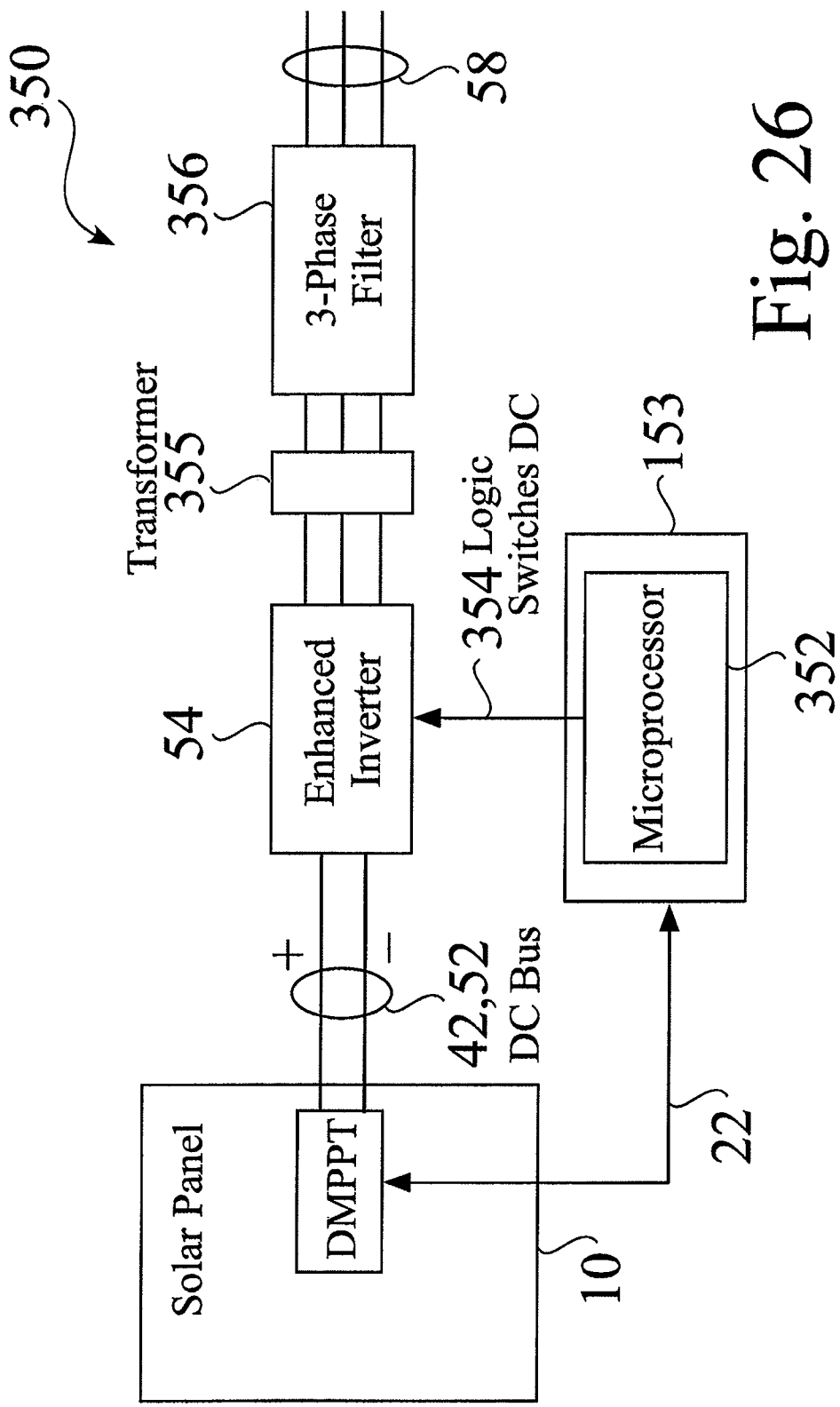
FIG. 26 is a schematic block diagram showing microprocessor-based enhancement of an inverter, such as to eliminate one or more levels of harmonics.

A microprocessor 352 (FIG. 26), such as located at a server 153 embedded within the inverter housing 50, generates a calculated smart switching pulse train signal 200, such as shown above. The calculated smart switching pulse train signal 200 is then passed 366 (FIG. 27) to the driver cards or boards 188, such as through fiber optic links 190 or via copper wire 190. The driver boards 188 then convert these digital pulses 202 (FIG. 19), e.g. 202a-202g, into power driving signals for the IGBTs 192. The IGBTs 192 controllably follow the turn-on pulses 204 and turn-off pulses 206 of the original smart switching pulse train signal 200, thus switching the high DC Bus voltage. This switching power is then transformed to the AC grid voltage 58 by a transformer 355 (FIG. 26) and a relatively small filter 356 (FIG. 26). The resultant output sine wave is very low in distortion. The use of smart switching 200 inputs to the enhanced inverters 54 therefore reduces power loss, reduces harmonics, reduces filter requirements, and reduces cost.

Figure 20:
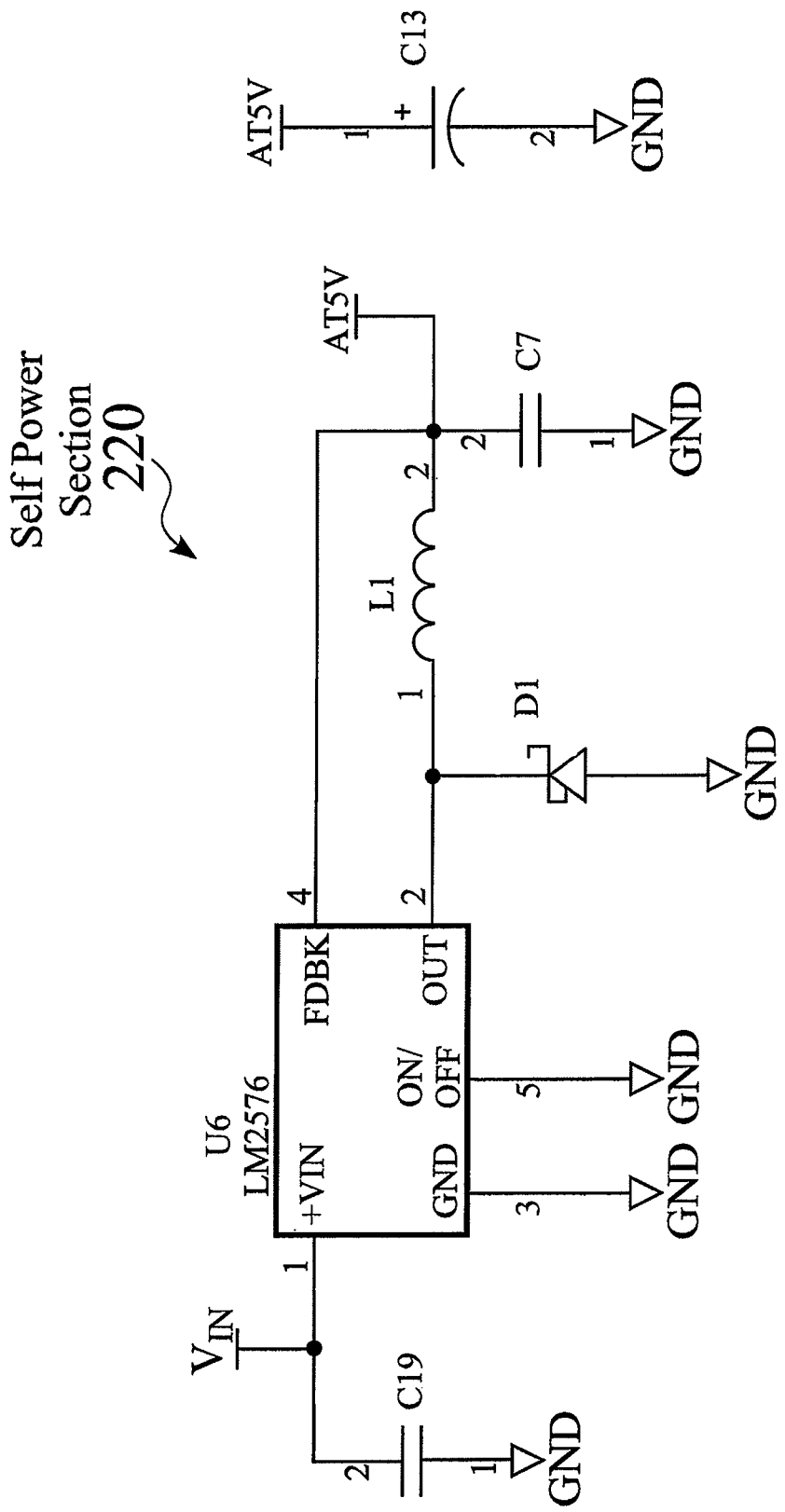
FIG. 20 is a schematic circuit diagram of an exemplary self-power section of a DMPPT module.

Controller and Power Supply. As described above, each of the DMPPT modules 18 are typically powered from their respective solar panels 10, such as to reduce the wiring requirements and improve the overall efficiency of the system 40. FIG. 20 is a schematic circuit diagram of an exemplary self-power section 220 of a DMPPT module 18, which generates local control voltage for the DMPPT module 18 from the solar panel 10.

In some embodiments, when the solar panel 10 begins generating about 4.5 to 6.5 volts DC, there is enough power to start the DMPPT module 18. One of the benefits realized by this configuration is that the system 40 as a whole can wake up automatically, off the external AC grid 58. For a system 40 configured with externally mounted solar panels 10 that are externally mounted on the surface of the Earth E, e.g. such as but not limited to stand-alone panels 10 or building-mounted panels 10, the user USR is able to observe this wake up phenomena as the sun S rises in the morning, and as it sets in the evening, when the DMPPT modules 18 shut down for the night.

Boost Circuits for DMPPT Modules. FIG. 21 is a schematic circuit diagram of an exemplary boost circuit 250 for a DMPPT module 10.

Voltage and Current Monitoring for Distributed Multi-Point Power Point Tracking

Figure 22:
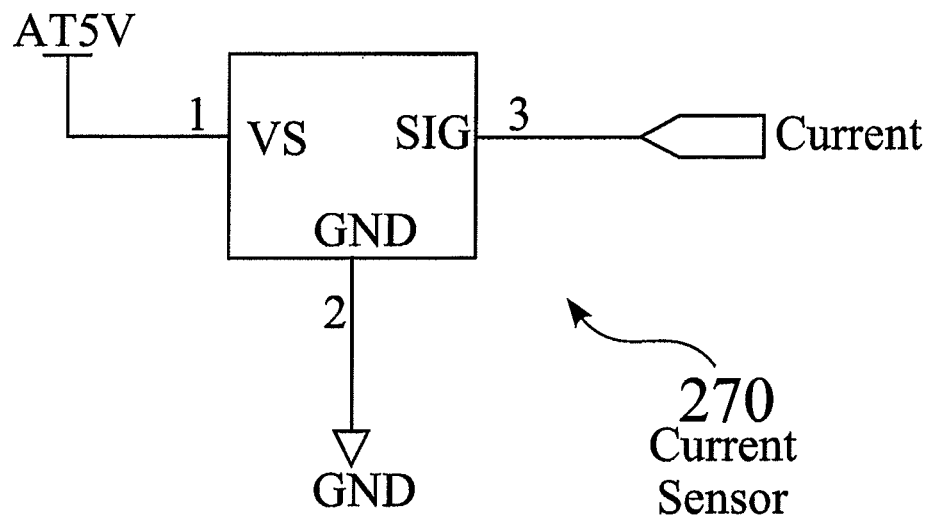
FIG. 22 is a schematic circuit diagram of an exemplary current sensor for a DMPPT module.
Figure 23:
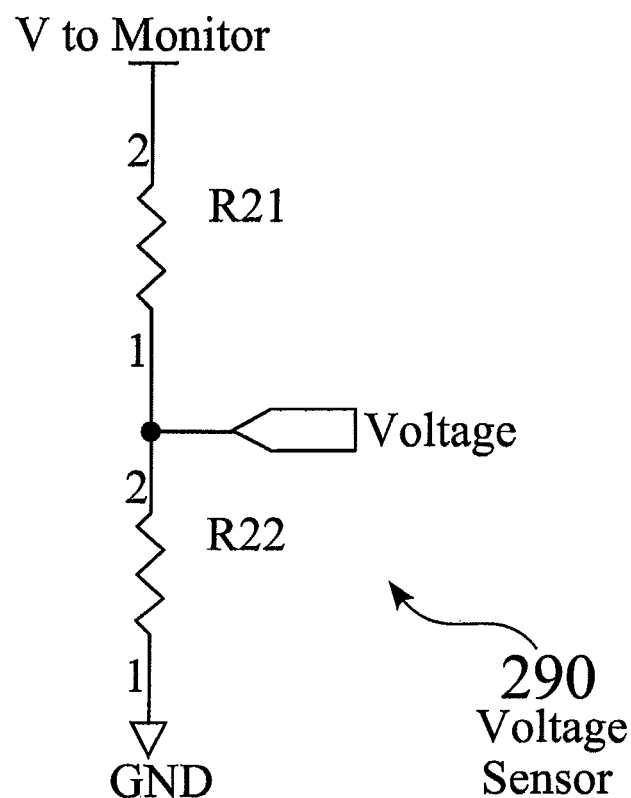
FIG. 23 is a schematic circuit diagram of an exemplary voltage sensor for a DMPPT module.

Modules. FIG. 22 is a schematic circuit diagram of an exemplary current sensor 270 for a DMPPT module 18, such as implemented by a V/I monitor 82 (FIG. 7) and associated hardware, e.g. a current loop 83 (FIG. 7). FIG. 23 is a schematic circuit diagram of an exemplary voltage sensor 290 for a DMPPT module 18. The output voltage and current are reported back to the embedded server 153 at the inverter cabinet 50, while used locally by the DMPPT controller 80 (FIG. 7) to provide stable regulated output 90 for the DC distribution bus 42,52 (FIG. 5, FIG. 6). The input voltage and current are used by the on-board controller 80, e.g. DSP, as part of the multi-level MPPT program.

The output voltage also plays into this control loop. A Hall-effect DC/AC current module and a 10 M ohm voltage dividing resistor network transforms these signals to an op-amp for scaling, and are then processed by the controller 80, e.g. DSP 80. This forms the basis of a per panel monitoring system.

Figure 24:
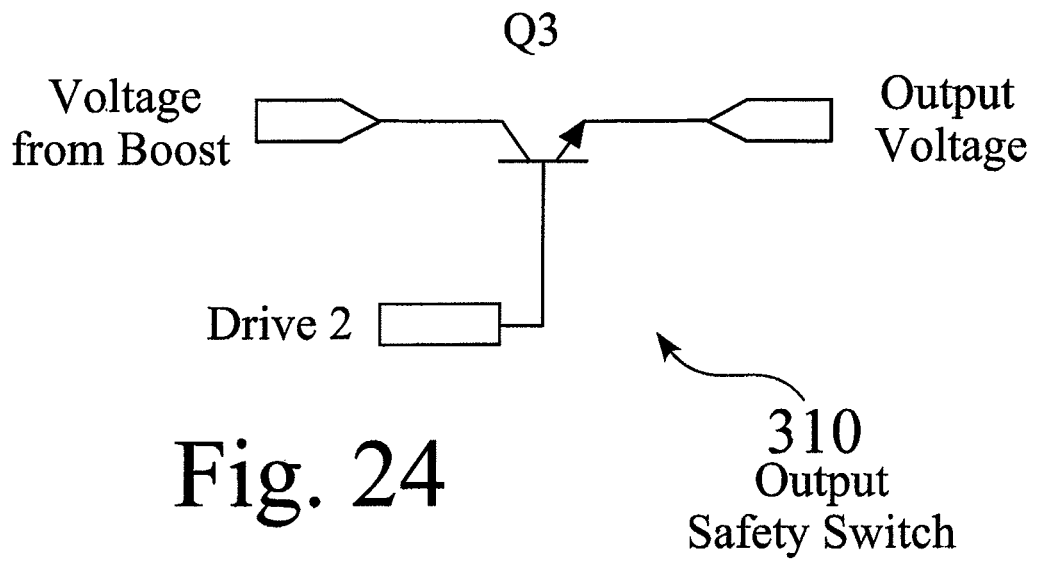
FIG. 24 is a schematic circuit diagram of an exemplary output safety switch for a DMPPT module.
Figure 25:
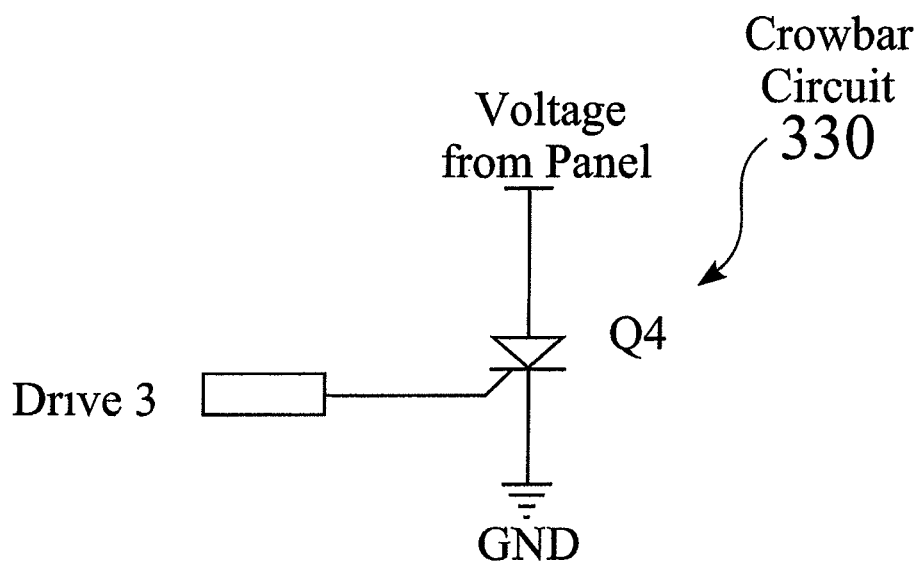
FIG. 25 is a schematic circuit diagram of an exemplary crowbar circuit for a DMPPT module.

System Safety and Use of Crowbar Circuits. FIG. 24 is a schematic circuit diagram of an exemplary output safety switch 310 for a DMPPT module 18. FIG. 25 is a schematic circuit diagram of an exemplary crowbar circuit 330 for a DMPPT module 18. The enhanced solar panel 10, such as seen in FIG. 1, preferably provides survivability from an output short circuit. As seen in FIG. 7, an input crowbar circuit 96, triggered by the microprocessor 80, is placed across the incoming power leads from the panel 10. In case of a fire, or any other maintenance procedure that requires the system to be de-energized, the input crowbar circuit 96 is triggered, thereby shorting out the solar panel 18. An output crowbar circuit 98 may also preferably be provided, such as to charge down capacitors when the unit is shut down.

The crowbar circuits 96,98 may be activated for a wide variety of reasons, such as for emergencies, installation, or maintenance. For example, during installation of the enhanced panels 10, the associated DMMPT modules 18 prevent high voltage from being transmitted to the output terminals 19a,19b (FIG. 1), until the panel is fully installed into the system 40. As well, if maintenance functions need to be performed near or on one or more panels 10, one or more of the solar panels 10 can be turned off, such as by triggering the crowbar circuits 96,98 through the DMPPT controllers 80.

The crowbar circuits 96,98 conduct and hold the solar panel 18 in a short-circuit condition until the voltage or current falls below the device's threshold level. To re-activate the solar panel 10, the current is typically required to be interrupted. This can typically be done either by manually breaking the circuit, or by waiting until the sunlight fades in late evening. This means that the system automatically resets its DMPPTs 18 during a period of darkness, e.g. the night.

Currently, one of the most cost effective crowbar circuits comprises a silicon controlled rectifier (SCR) 330. This allows the crowbars 96,98 to continue to function, even though the main circuits control power has been shorted. This removes the danger of high voltage DC power from the personnel, e.g. on a roof of a building where solar panels 10 are installed. The DMPPT system 18 automatically resets itself during the night, thus allowing for the completion of the work. If it is necessary for another day, the system 40 can operate in one of two modes. In a first mode, such as when communications 22 are present with the host 50, the host 50 can instruct the DMPPT devices 18 to shut down, thus allowing another period of safe work, e.g. on the roof. In a second mode, such as when there are no communications 22 with the host 50, the DMPPT module 18 may preferably fire, i.e. activate, the crowbar device(s) 96,98. To prevent unnecessary shutdowns, this non-communication method may preferably only occur if a status bit has been saved, e.g. in EEPROM memory at the module 18, indicating a fire or maintenance shutdown.

The current crowbar circuit 330 implemented for the DMPPT Module 18 is an SCR with its associated firing circuitry. The main control software, e.g. within the system server 153, preferably allows for a maintenance or fire shut down of the solar array system. This operates on a panel per panel basis, thus providing a safe solar array shutdown. The host system housing 50 can display the current array DC voltage, to indicate when it is safe to enter the roof area. The host system housing 50 may preferably be tied into the fire alarm system of the building, or may be controlled by a manual safety switch located by the host system itself. This addition to the DMPPT Modules 18 therefore enhances overall system performance, and improves safety for personnel.

Figure 27:
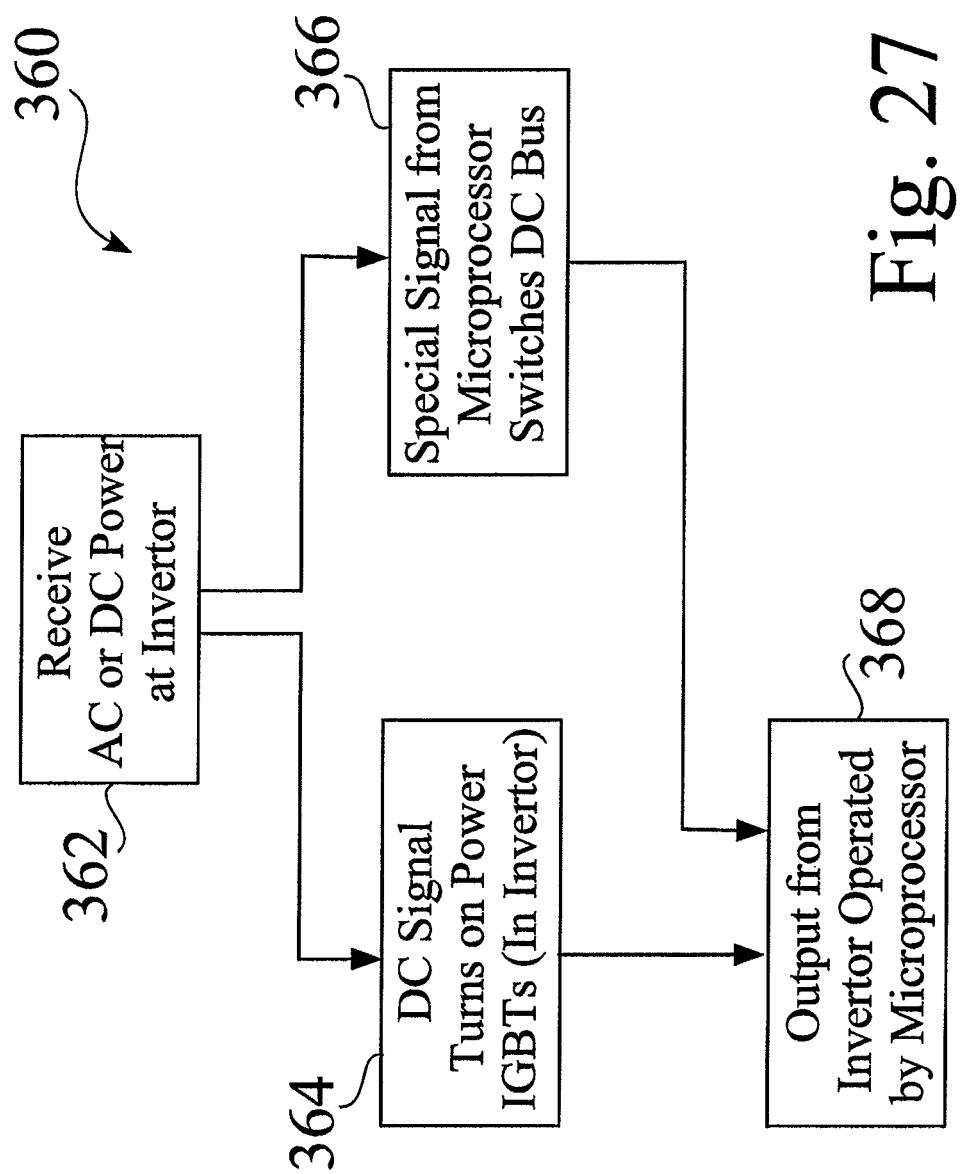
FIG. 27 is flowchart of exemplary operation of an enhanced inverter.

Enhanced Inverter Power Circuit Operation. FIG. 26 is a schematic block diagram 350 showing microprocessor-based pulse width modulation 354 of an enhanced inverter 54, such as to eliminate one or more levels of harmonics. FIG. 27 is flowchart of an exemplary PWM harmonic reduction process 360 for an enhanced inverter 54. As seen in FIG. 26, a microprocessor 352 may preferably be used to provide a driving signal 354 to each of the enhanced inverters 54. For example, as seen in FIG. 27, for a DC signal received 362 at the enhanced inverter 54, either the DC power 42,52 from the panels 10, or the AC bus power 58, may be used to turn on 364 the power to the inverter transistors 192 (FIG. 18), which may preferably comprise insulated gate bipolar transistors (IGBTs) 192. A special signal 354 (FIG. 26), which may preferably comprise a smart switching pulse train 200 (FIG. 19), e.g. such as but not limited to switching at 1.68 KHz, is sent from the microprocessor 352 at the embedded server 153 (FIG. 14), to switch the DC bus through the driver cards 188 (FIG. 18) and provide active elimination of one or more harmonics, such as to controllably reduce or eliminate the harmonics from the DC signal, e.g. third harmonics 3, 9, 15, etc. The AC signal output 368 from the enhanced inverter 54 provides increased power over conventional inverter systems.

Since the inverter 50 is built in module blocks 54, for a larger system 40 each inverter block 54 may preferably turn on when needed to increase system efficiency. Solid-state inverters 54 presently run better once they have more than about 45 percent load. Therefore, for a 140 kW system 40, as power increases through the day, a first module 54 will turn on to provide power until there is enough power for the second module 54. The second module 54 will come on and the two modules 54, e.g. 54a and 54b will share the load (and still above the 45% point) until a third module 54 is needed. The same is true until all four modular inverters 54 are on. Later in the day, when power from the solar array 34 begins dropping off, each modular inverter 54 will drop off as necessary, until the system 40 shuts down for the night. This keeps the system 40 running at peak efficiency longer than a single large inverter, thus generating more power for the AC grid 58.

The use of smart switching of the inverters 54, as described above, delivers more power to the grid, since less solar power is converted into heat from the switching of the transistors. Furthermore, since a smaller filter is required (due to harmonic cancellation), there is more power available for pumping to the grid.

Another benefit of the modular system 40 is redundancy. For example, in a system having more than one enhanced inverter 54, if one enhanced inverter 54 fails for some reason, the entire system 40 does not come down. The system can continue to pump power out to the AC grid 58 with what capacity is left in the system 40.

Figure 28:
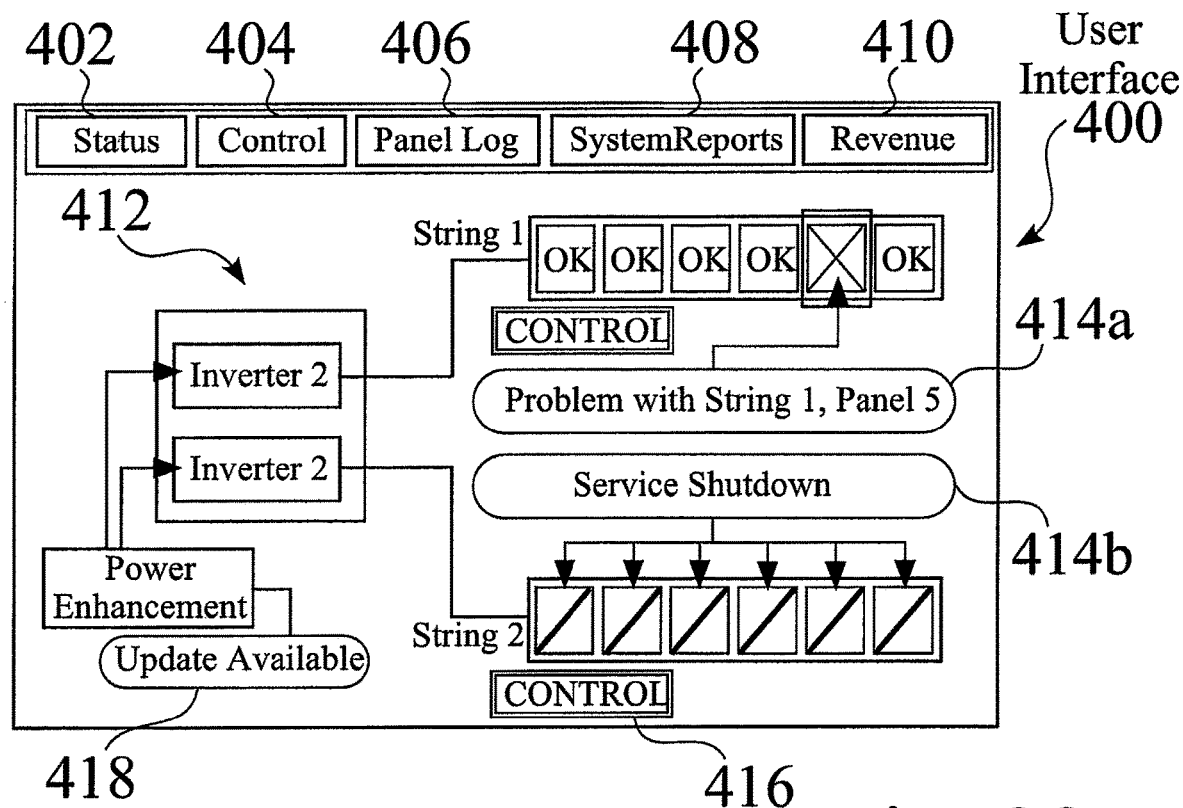
FIG. 28 is an exemplary user interface for monitoring and/or control of an enhanced power harvesting system comprising power modules having DMPPT modules.

FIG. 28 is an exemplary user interface 400, such as comprising a web page 157 (FIG. 14), for monitoring and/or control of an enhanced power harvesting system 40 comprising enhanced inverters 54, and power modules 10 having DMPPT modules 18. The exemplary user interface 400 seen in FIG. 28 may typically comprise any of system, array and/or component level status 402, control 404, logs 406 for one or more panels 10, system reports 408, and revenue tracking 410. For example, an exemplary system status screen 412 is seen in FIG. 28, such as to indicate current operating status of different strings 36 of solar panels 10.

As seen in FIG. 28, a first string 36 of panels comprises six panels 10, wherein panels 1-4 and 6 in the string are indicated 414a as being online and OK, while the fifth panel 10 in the first string is indicated 414a as being a problem and is currently taken offline. As also seen in FIG. 28, a second string 36 of panels comprises six panels 10, wherein panels 1-6 in the second string are indicated 414b as being shutdown for service, such as controlled 416 through the user interface 400.

The user interface 400 may typically be accessed through a wide variety of terminals, such as directly through an embedded server 153, locally through a connected terminal 156, or at another terminal 160, such as accessible through a network 158. In some embodiments, the system 40 may provide other means for alerts, status, and/or control, such as but not limited to network communication 155 to a wireless device 160, e.g. such as but not limited to a laptop computer, a cell phone, a pager, and/or a network enabled cellular phone or PDA.

As each of the panels 10 preferably comprises DMPPT functionality 18, wherein the DMPPTs provide monitoring at the panel level, the system 40 is readily informed, such as over the communication links 22 between the DMPPTs 18 and the invertors 54 or housing 50, of the operating status of each panel 10 in any size of array 34.

Furthermore, the DMPPTs 18 similarly provide troubleshooting and diagnostics at the panel level. For example, if there is a problem with one or more panels 10, such as not working, shut down locally by a controller 80, dirty, or shaded, the system 40 will be informed over the communication links 22 of any and all panel-level information, and can alert the user USR. All information from the panels 10 is typically logged into a database 154, where performance, history trends, and predications of future performance can be calculated. The database 154 may preferably be connectable through a network 158, such as the Internet, i.e. the World Wide Web, wherein viewing, and even control and/or maintenance, may be done through a web browser at a remote terminal 160.

As each enhanced panel 10 is connected to an associated DMPPT module 18, problems can be identified and pinpointed for both broken and sub-performing panels 10, wherein such panels 10 may readily be found and replaced, i.e. the system 40 identifies the exact panel(s) with a problem, thus significantly reducing the time required for repairs.

FIG. 29 shows an enhanced power harvesting system 40 located on the Earth E, wherein one or more panels 10 within a string 36 have different angles (0, 45, 90) or orientations (E, W, N, S). Conventional solar panels systems require solar panels having different angles of tilt to be serviced by different inverters. However, since the output of the DMPPT modules 18 at the panel level can be regulated, enhanced panels 10 having different tilt angles 422 can be fed into the same inverter, e.g. an enhanced inverter 54. The enhanced system 40 therefore allows panels to be mixed, such by varying tilt 422, from flat (0 degrees) through 90 degrees, and/or by varying directional orientation 424, by mixing East, West, South and/or North facing panels 10.

As well, since the output of the DMPPT modules 18 at the panel level can be regulated, strings 36 having different lengths of enhanced panels 10 may be fed into the same inverter, e.g. an enhanced inverter 54 or even a conventional inverter. For example, if one string 36 has an extra panel 10, or shorts a panel 10, the DMPPT modules can adjust the output of the remaining panels 10 in a string 36 to allow this "incorrect" string size to function in the system 40, without adverse affects.

Similarly, the use of DMPPT modules 40 allows different size panels or different manufacturers to co-exist in the same array 34. Therefore, instead of having to buy all of the panels from a single manufacturer to reduce mismatch problems, the DMPPT allows the use of various panels and even different wattages within the same system 40. Such versatility provides significant architectural freedom in panel placement and design, wherein solar panels equipped with an associated DMPPT module 10 allow unique layouts to accommodate different architectural features on any building or facility.

Furthermore, the use of DMPPT modules 40 addresses panel and string mismatch losses. At the present time, no two panels 10 are alike, and often are specified with a plus or minus 5 percent rating. While conventional solar panel strings 36 operate only as well as the weakest panel 10 in the string, the DMPPT modules 18 can adjust the output of the panels 10 to boost their output. Similarly, the DMPPT modules 18 for a string 34, such as controlled by the server over the communications links 22, can boost the power as needed to reduce or even eliminate string mismatch losses.

Block Diagram of Operation Software. The software for the DMPPT modules 18 can be broken down into various sections as most are interrupt driven. When the modules 18 wake up in the morning, they each perform a routine check to ensure that everything is functioning properly. The modules 18 preferably check the status of a fire alarm flag, which is stored in EEPROM inside the microprocessor/controller 80 of the DMPPT Module. The microprocessor currently implemented for the controller 80 includes FLASH, EEPROM, and SRAM memories on the chip.

While the modules 18 watch the communications line 22 for activity, such as to see if the panel 18 needs to shutdown before power levels rise to a dangerous level. If necessary, the DMPPT Module 18 fires the crowbar circuit 96,98 to remain off line. Otherwise, it will proceed to the wait stage, until enough power is available for it to perform its functions.

Multiple Power Inputs for the Enhanced Inverter Units. Since the inverter design has been modified so that the MPPT has been shifted to maximize harvest, the enhanced inverters, as well as the DMPPT modules may readily be adapted for different means of power generation, such as but not limited to fuel cells, wind power, Hydro, Batteries, Biomass, and Solar power. The inverters can operate at 50 Hz, 60 Hz, or 400 Hz to cover a vast range of applications. The system can also be designed for on-grid or off-grid applications.

While some embodiments of the structures and methods disclosed herein are implemented for the fabrication of solar panel system, the structures and methods may alternately be used for a wide variety of power generation and harvesting embodiments, such as for fuel cells or batteries, over a wide variety of processing and operating conditions.

As well, while some embodiments of the structures and methods disclosed herein are implemented with a server 153 within the modular inverter housing 50, other embodiments may comprise dedicated servers 55 within each of the enhanced inverters 54, which may also be in combination with a housing server 153.

Furthermore, while the exemplary DMPPT modules 18 disclosed herein are located at each of the panels, dedicated DMPPT modules can alternately be located at different points, such as ganged together locally near the panel strings 36. In present embodiments, however, the DMPPT modules 18 disclosed herein are located at each of the panels 10, such as to provide increased safety, since the crowbar circuitry 96,98 is located at the panel, and upon activation, no high voltage extends from the panels on the output connections 21.

Accordingly, although the invention has been described in detail with reference to a particular preferred embodiment, persons possessing ordinary skill in the art to which this invention pertains will appreciate that various modifications and enhancements may be made without departing from the spirit and scope of the claims that follow.

The invention claimed is:

1. An apparatus comprising:
   a direct current (DC) input connection configured to be coupled to one or more DC power sources;
   a DC output connection comprising output terminals;
   a controller coupled to the DC input connection and the DC output connection; and
   circuitry, connected across the DC output terminals, configured to create a short circuit between the DC output terminals based on a shutdown state of the apparatus occurring.

2. The apparatus of claim 1, further comprising a maximum power point tracking module configured to:
   provide maximum power point tracking of the one or more DC power sources.

3. The apparatus of claim 2, wherein the maximum power point tracking module is configured to communicate with a server.

4. The apparatus of claim 1, wherein the controller is configured to communicatively couple to a server via a communication link that comprises a wireless connection and configured to adjust DC power received from the one or more DC power sources based on communication received from the server.

5. The apparatus of claim 1, wherein the DC output connection is configured to be coupled in series with a plurality of other apparatuses.

6. The apparatus of claim 1, wherein the circuitry connected across the DC output terminals comprises a switch.

7. The apparatus of claim 1, wherein the controller is configured to shut down, based on a signal received from a server, operation of the apparatus.

8. The apparatus of claim 1, further comprising an inverter configured to generate a signal.

9. The apparatus of claim 1, further comprising a monitoring module configured to:
   detect a presence of a problem; and
   generate a signal indicating the problem.

10. The apparatus of claim 1, wherein the circuitry connected across the output terminals is configured to create a second short circuit between the output terminals in case of the one or more DC power sources not producing power.

11. The apparatus of claim 1, wherein the circuitry comprises a crowbar circuit and the controller is configured to drive the crowbar circuit to short the output terminals in response to an absence of a signal from a server.

12. A method, comprising:
   receiving input power from one or more direct current (DC) power sources at an input terminal of a power device;
   outputting power, received from the one or more DC power sources, at a DC output connection of the power device;
   receiving, from a server via a communication link, a signal;
   adjusting, based on the received signal, an input DC power received from the one or more DC power sources; and
   upon shutdown of the power device, shorting, using a bypass circuit coupled to the DC output connection, the DC output connection.

13. The method of claim 12, further comprising:
   tracking a maximum power point of the one or more DC power sources; and
   communicating maximum power point tracking information via the communication link.

14. The method of claim 13, further comprising outputting, based on the tracking, a regulated voltage on the DC output connection.

15. The method of claim 12, further comprising:
detecting a presence of a problem; and
generating a second signal indicating the problem.

16. The method of claim 12, wherein the receiving the signal comprises receiving, from the server via a wireless connection, the signal.

17. The method of claim 12, further comprising: outputting the power at the DC output connection through a plurality of power devices connected in series to the DC output connection.

18. The method of claim 12, wherein the bypass circuit comprises a switch.

19. The method of claim 12, wherein the shorting comprises shorting, by the bypass circuit, the DC output connection until a voltage or a current at the DC output connection is below a threshold level.

20. The method of claim 12, further comprising stopping power output at the DC output connection in response to an absence of a signal via the communication link.

* * * * *